US008654571B2

(12) United States Patent
John et al.

(10) Patent No.: US 8,654,571 B2
(45) Date of Patent: Feb. 18, 2014

(54) STATIC RANDOM-ACCESS CELL, ACTIVE MATRIX DEVICE AND ARRAY ELEMENT CIRCUIT

(75) Inventors: Gareth John, Berkshire (GB); Patrick Zebedee, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/347,856

(22) Filed: Jan. 11, 2012

(65) Prior Publication Data

US 2012/0106238 A1 May 3, 2012

Related U.S. Application Data

(63) Continuation-in-part of application No. 13/176,047, filed on Jul. 5, 2011, now Pat. No. 8,547,111, which is a continuation-in-part of application No. 12/830,477, filed on Jul. 6, 2010.

(51) Int. Cl.
*G11C 11/00* (2006.01)
*G11C 7/00* (2006.01)

(52) U.S. Cl.
USPC ................. 365/154; 365/189.16; 365/189.14; 365/189.15; 324/649

(58) Field of Classification Search
None
See application file for complete search history.

(56) References Cited

U.S. PATENT DOCUMENTS

| | | | | |
|---|---|---|---|---|
| 3,949,162 | A | 4/1976 | Malueg | |
| 5,194,862 | A | 3/1993 | Edwards | |
| 5,798,746 | A * | 8/1998 | Koyama | 345/98 |
| 6,565,727 | B1 | 5/2003 | Shenderov | |
| 6,911,132 | B2 | 6/2005 | Pamula et al. | |
| 7,163,612 | B2 | 1/2007 | Sterling et al. | |
| 7,255,780 | B2 | 8/2007 | Shenderov | |
| 7,329,545 | B2 | 2/2008 | Pamula et al. | |
| 2003/0006977 | A1 * | 1/2003 | Hanari et al. | 345/204 |
| 2003/0164295 | A1 | 9/2003 | Sterling | |
| 2006/0012575 | A1 | 1/2006 | Knapp et al. | |
| 2006/0017710 | A1 | 1/2006 | Lee et al. | |

(Continued)

FOREIGN PATENT DOCUMENTS

| | | | |
|---|---|---|---|
| EP | 0 464 908 | A2 | 1/1992 |
| GB | 2475054 | A | 5/2011 |

(Continued)

OTHER PUBLICATIONS

Patrick Tabeling, "Introduction to Microfluidics", Oxford University Press, ISBN 0-19-856864-9, Section 2.8, Feb. 2, 2006.

(Continued)

*Primary Examiner* — Melissa Koval
*Assistant Examiner* — Stephen G Armstrong
(74) *Attorney, Agent, or Firm* — Renner, Otto, Boisselle & Sklar, LLP

(57) ABSTRACT

A static random-access memory (SRAM) cell which includes: a sampling switch and a feedback switch; and a first inverter and a second inverter connected in series whereby an output of the first inverter is connected to an input of the second inverter. An input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

20 Claims, 29 Drawing Sheets

(56) References Cited

U.S. PATENT DOCUMENTS

| | | | | |
|---|---|---|---|---|
| 2006/0114247 | A1 | 6/2006 | Brown | |
| 2007/0030255 | A1 | 2/2007 | Pak et al. | |
| 2007/0040814 | A1 | 2/2007 | Lee et al. | |
| 2007/0133334 | A1 * | 6/2007 | Peng et al. | 365/225.7 |
| 2007/0216657 | A1 | 9/2007 | Konicek | |
| 2008/0085559 | A1 | 4/2008 | Hartzell et al. | |
| 2010/0039406 | A1 | 2/2010 | Lee et al. | |
| 2010/0163414 | A1 * | 7/2010 | Gillies et al. | 204/547 |
| 2010/0194699 | A1 | 8/2010 | Chang | |

FOREIGN PATENT DOCUMENTS

| | | | |
|---|---|---|---|
| GB | 2475055 | A | 5/2011 |
| JP | 2005-510347 | A | 4/2005 |
| WO | 03/045556 | A2 | 6/2003 |
| WO | 2008/055256 | A2 | 5/2008 |
| WO | 2008/101194 | A2 | 8/2008 |
| WO | WO 2009005680 | A1 * | 1/2009 |
| WO | 2010/027894 | A2 | 3/2010 |

OTHER PUBLICATIONS

"Lab on a Chip", 2002, vol. 2, pp. 96-101.

"Lab Chip", 2004, vol. 2, 4, 310-315.

Ren et al., "Automated on-chip droplet dispensing with volume control by electro-wetting actuation and capacitance metering", Science Direct, Sensors and Actuators B 98 (2004) pp. 319-327.

Takeda, "Hot Carrier Effects in MOS Devices", Academic Press Inc., ISBN 0-12-682240-9, pp. 40-42, 1995.

Robert A. Hayes, "Electrowetting-Based Information Displays", SID 08 Digest, pp. 651-654, May 2008.

Brown et al., "A Continuous-Grain Silicon-System LCD With Optical Input Function", IEEE Journal of Solid State Circuits, vol. 42, Issue 12, Dec. 2007, pp. 2904-2912.

Lee et al., "Semiconductor Device for Modelling VLSI", Prentice-Hall, ISBN 0-13-805656-0, pp. 191-193, 1993.

Stewart et al., "High performance gated lateral polysilicon PIN diodes", Solid State Electronics, vol. 44, Issue 9, p. 1613-1619, Sep. 1, 2000.

Patrick Tabeling, "Introduction to Microfluidics", Oxford University Press, ISBN 0-19-856864-9, pp. 211-214, Feb. 2, 2006.

Thomas P. Hunt et al., "Integrated circuit/microfluidic chip to programmably trap and move cells and droplets with dielectrophoresis", Lab Chip, 2008, 8, 81-87.

Lueder, Addressing of LCDs with Poly-Si TFTs, Mar. 24, 2010.

European Search Report for corresponding European Application No. 11172766.5 dated Sep. 30, 2011.

Co-pending U.S. Appl. No. 12/830,477, filed Jul. 6, 2010 (application and current claims provided).

Co-pending U.S. Appl. No. 13/176,047, filed Jul. 5, 2011 (application provided).

Office Action for sibling U.S. Appl. No. 13/176,047, filed Jul. 5, 2011.

* cited by examiner

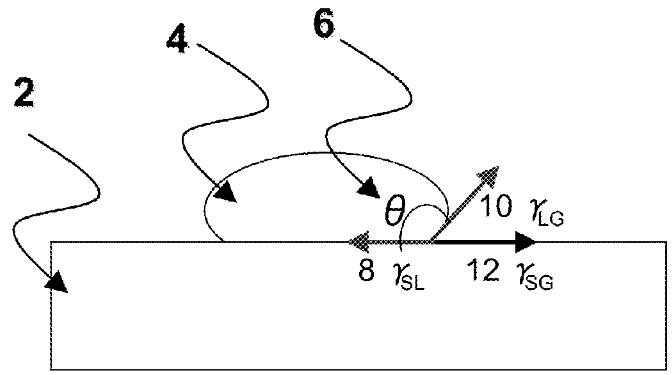
FIGURE 1: PRIOR ART
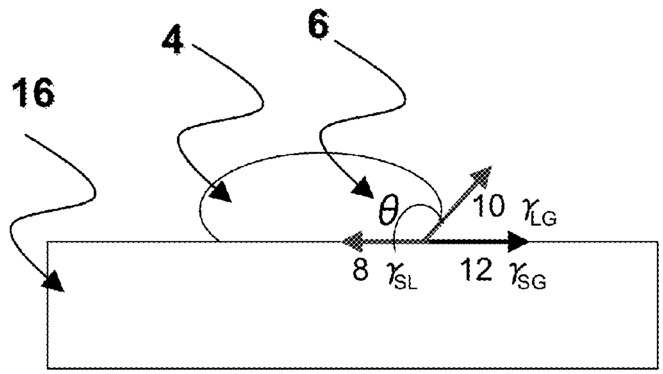
*Hydrophobic (θ>90°)*
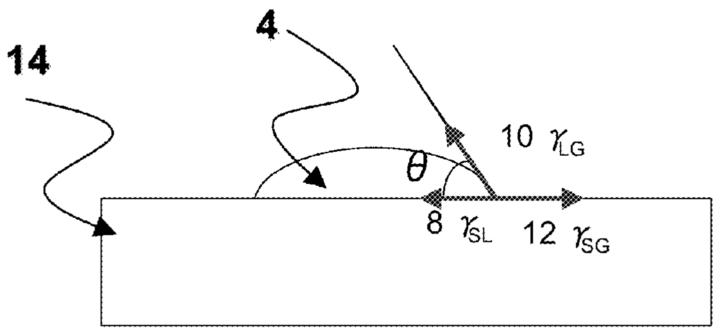
*Hydrophilic (θ<90°)*
FIGURE 2: PRIOR ART

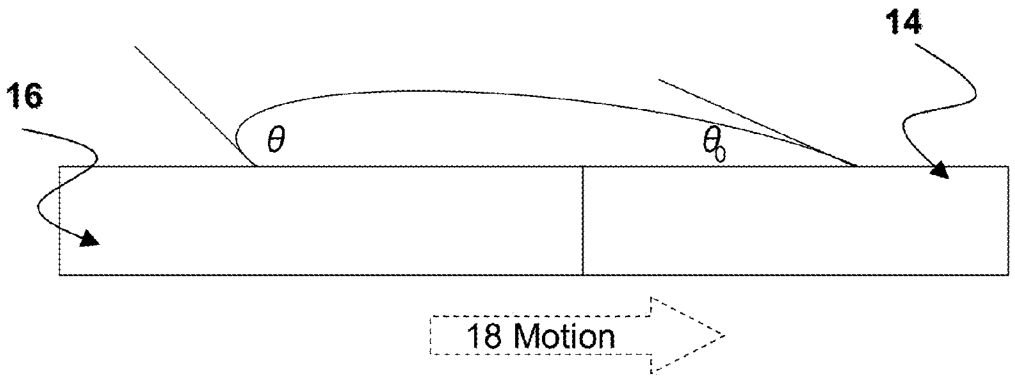
FIGURE 3: PRIOR ART
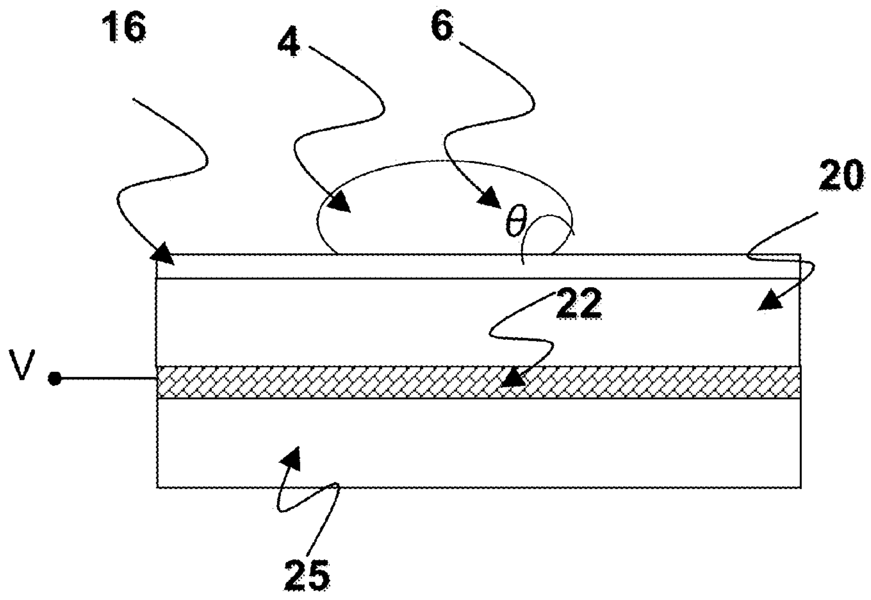
FIGURE 4: PRIOR ART

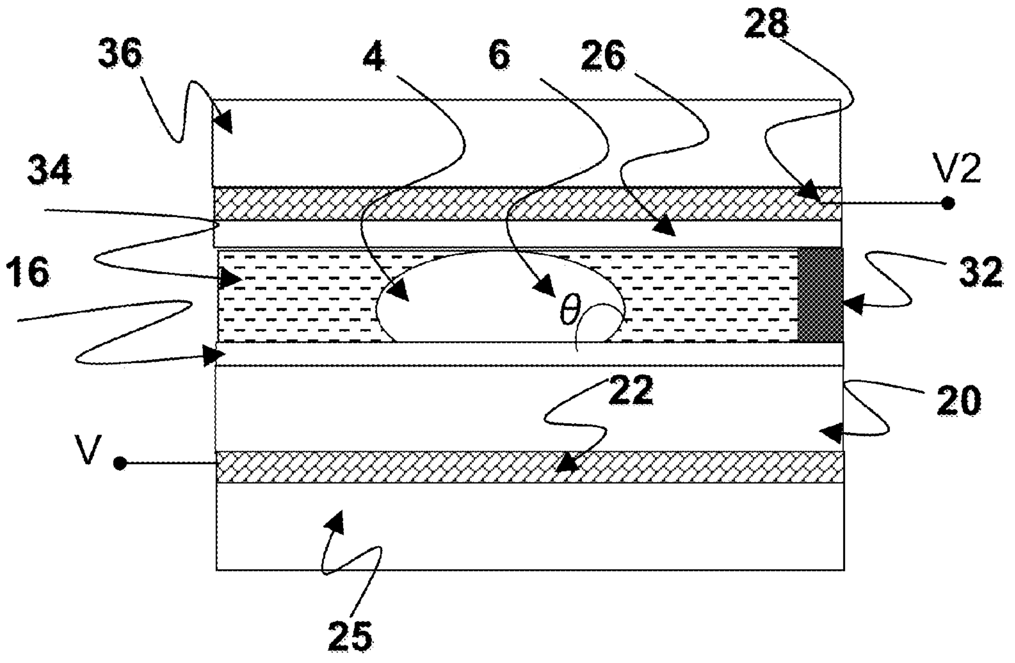
FIGURE 5: PRIOR ART
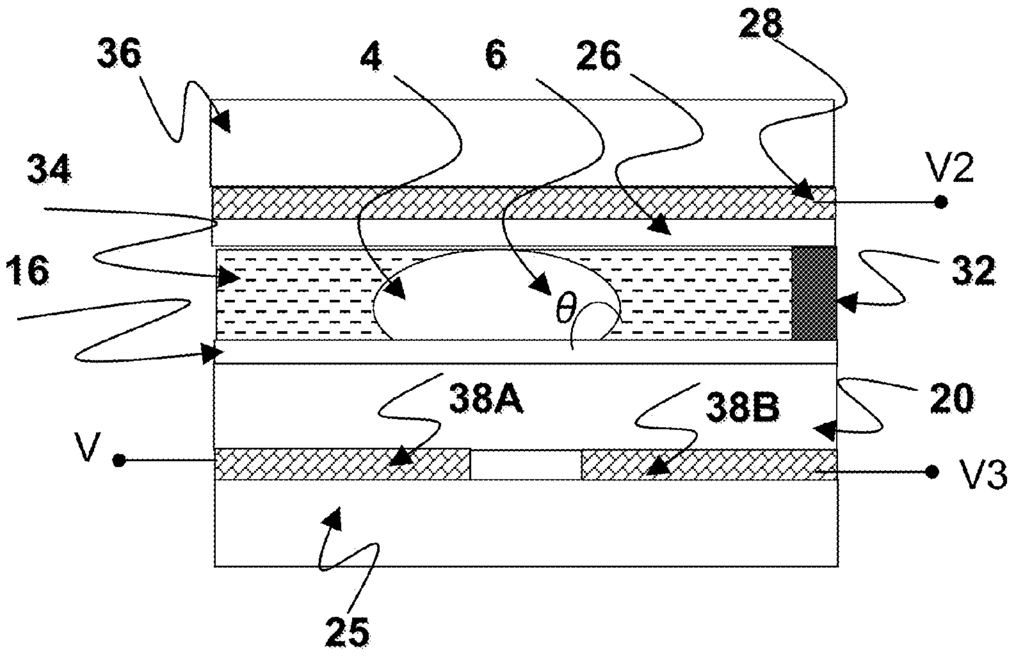
FIGURE 6: PRIOR ART

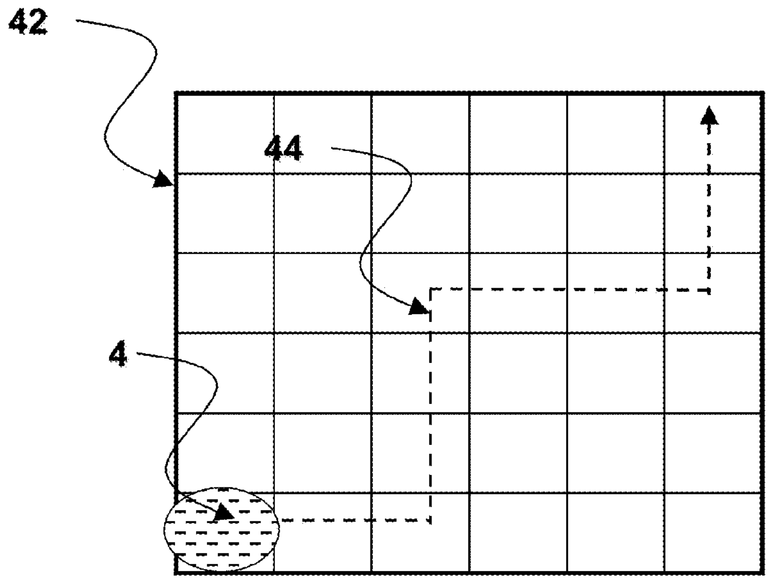
FIGURE 7: PRIOR ART
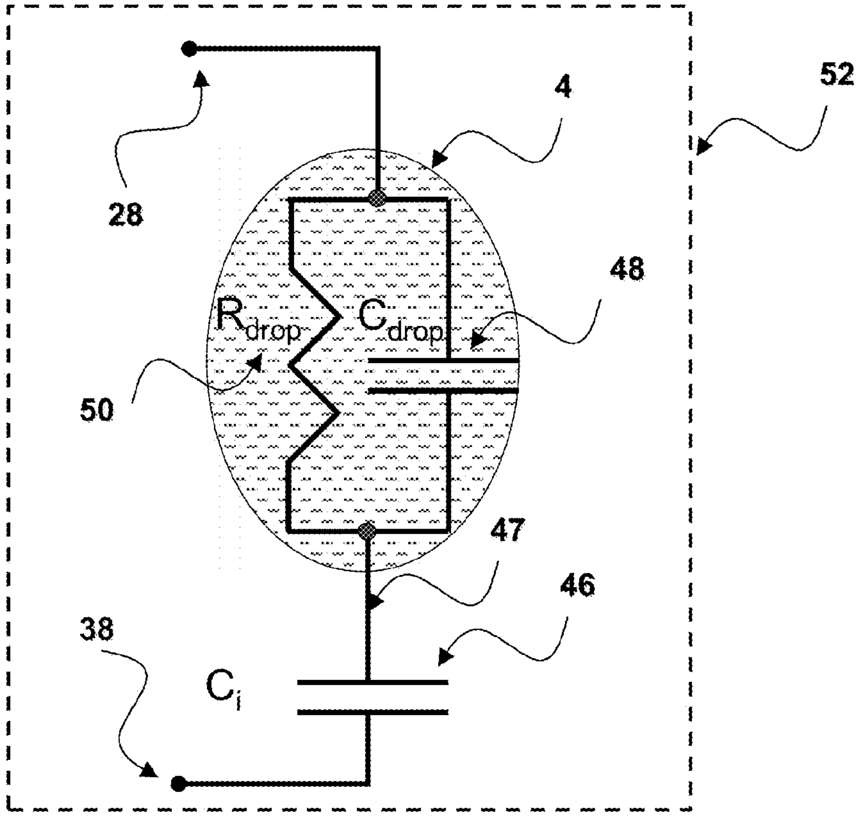
FIGURE 8: PRIOR ART

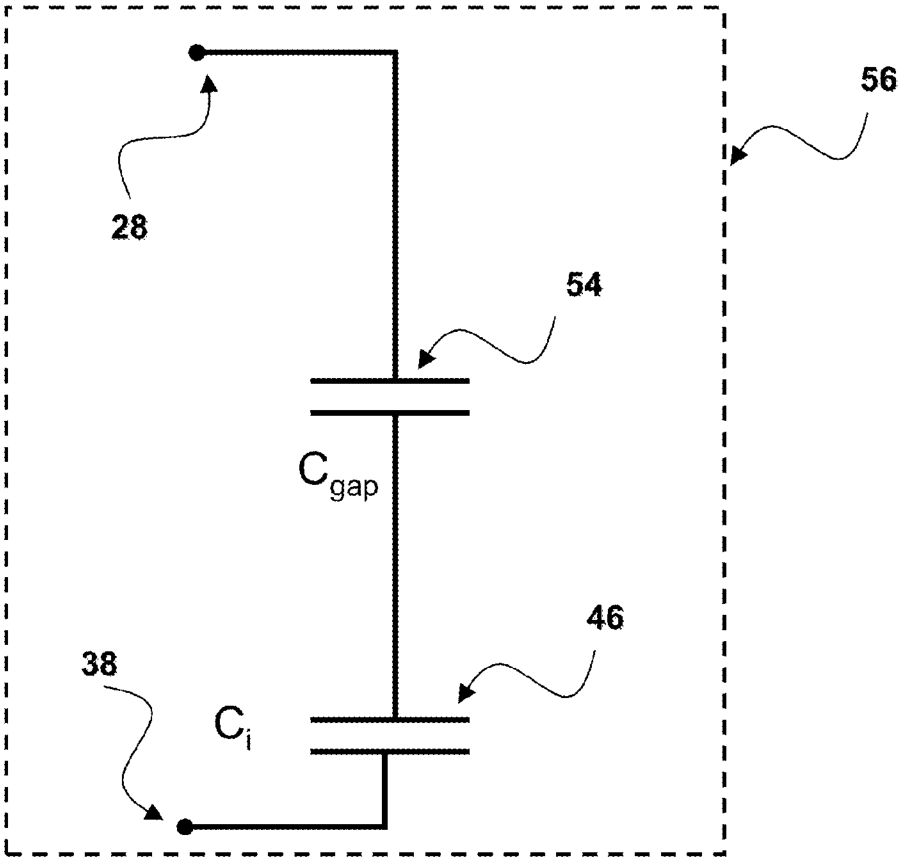
FIGURE 9: PRIOR ART
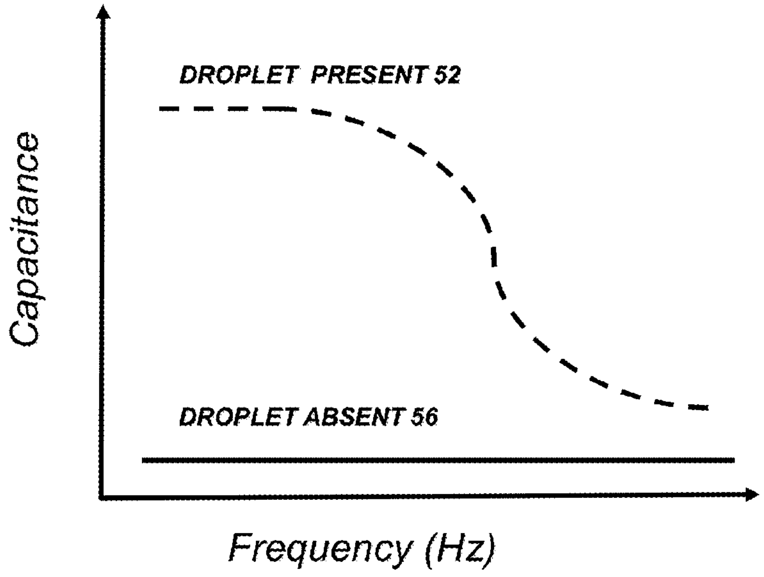
FIGURE 10: PRIOR ART

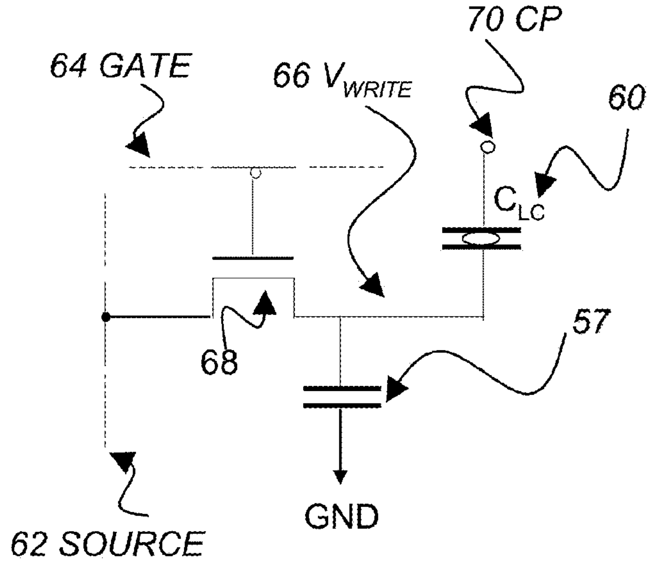
FIGURE 11: PRIOR ART
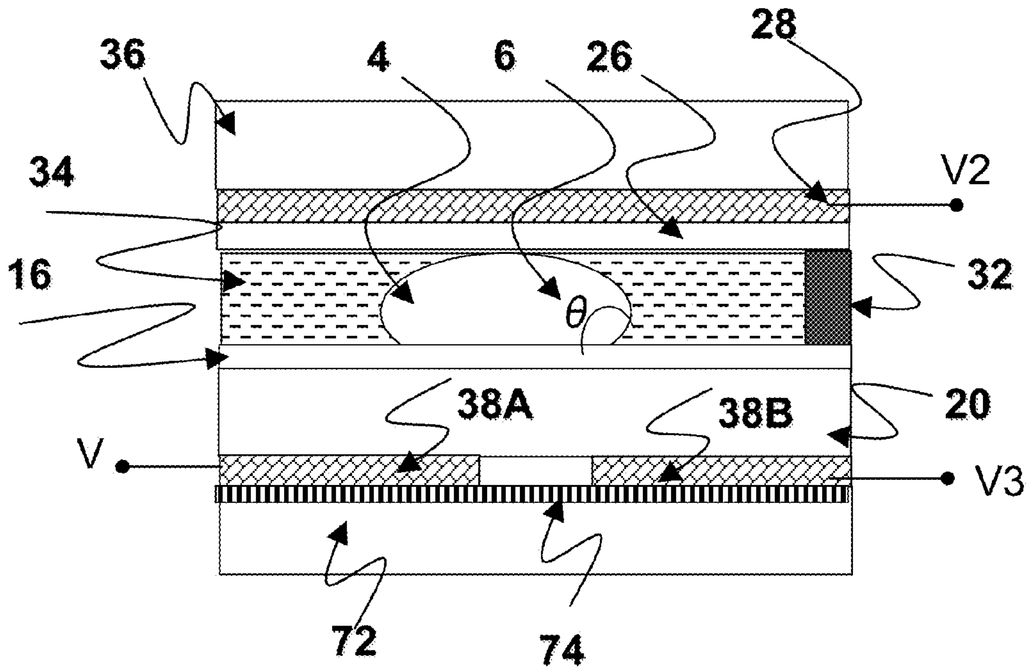
FIGURE 12: PRIOR ART

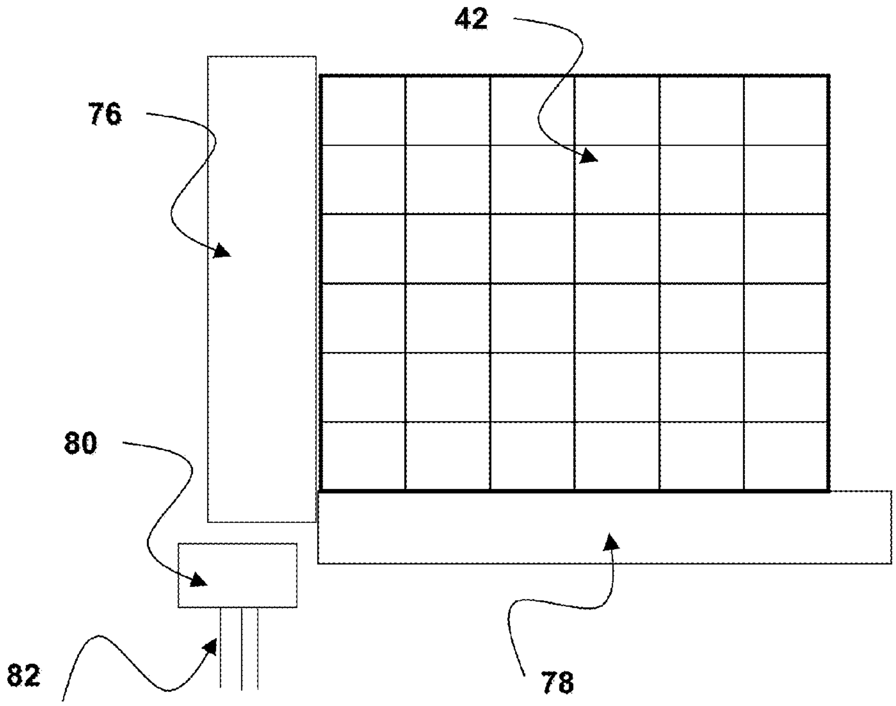
FIGURE 13: PRIOR ART
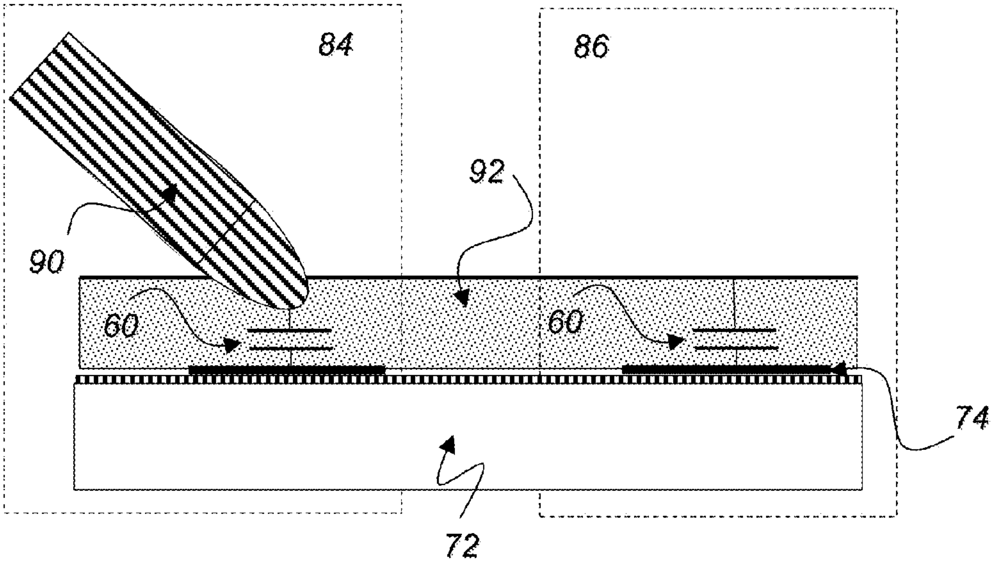
FIGURE 14: PRIOR ART

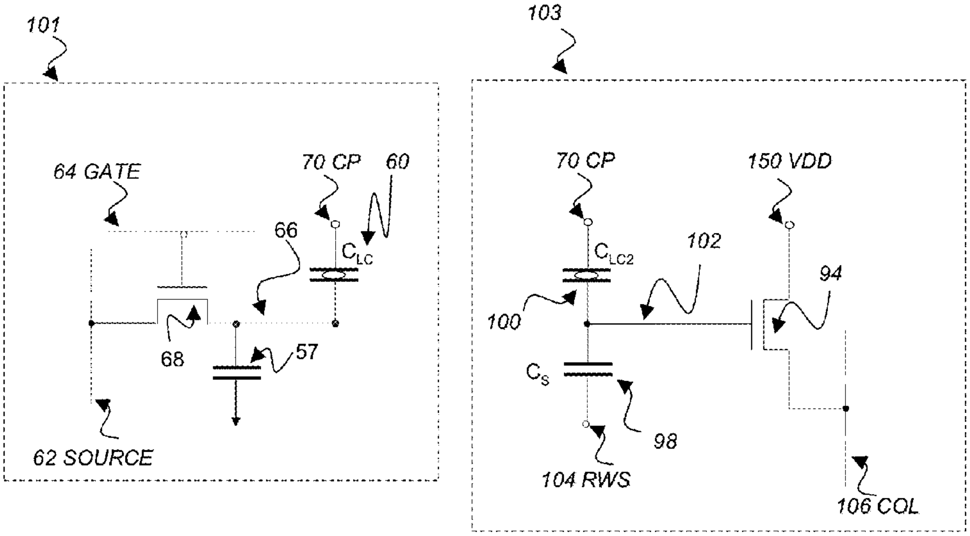
FIGURE 15: PRIOR ART
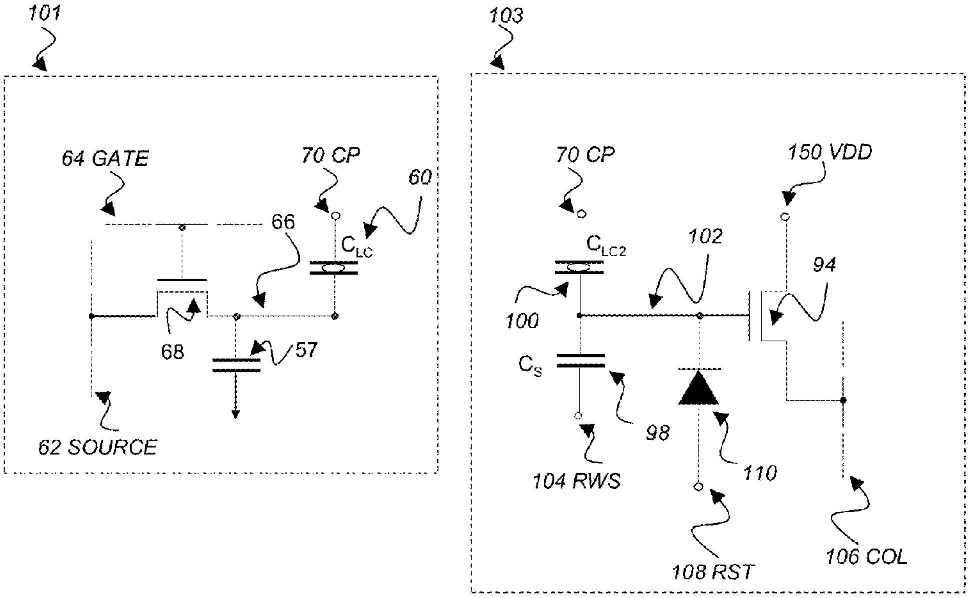
FIGURE 16: PRIOR ART

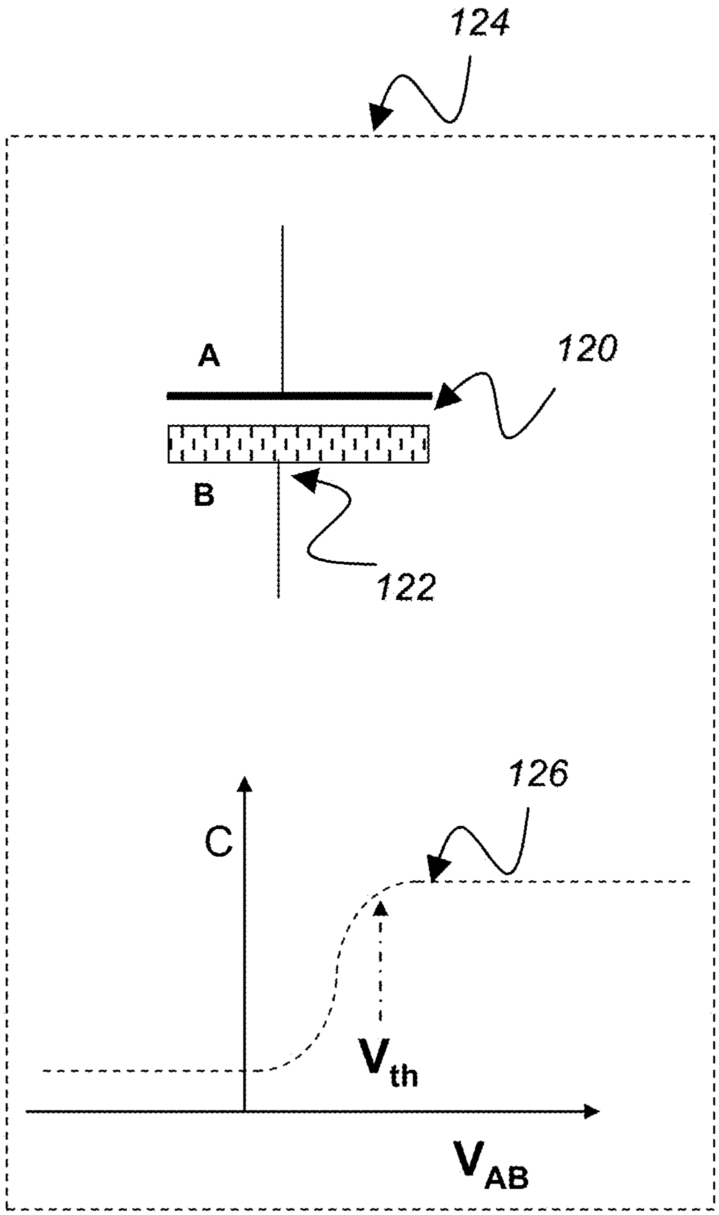
FIGURE 17: PRIOR ART

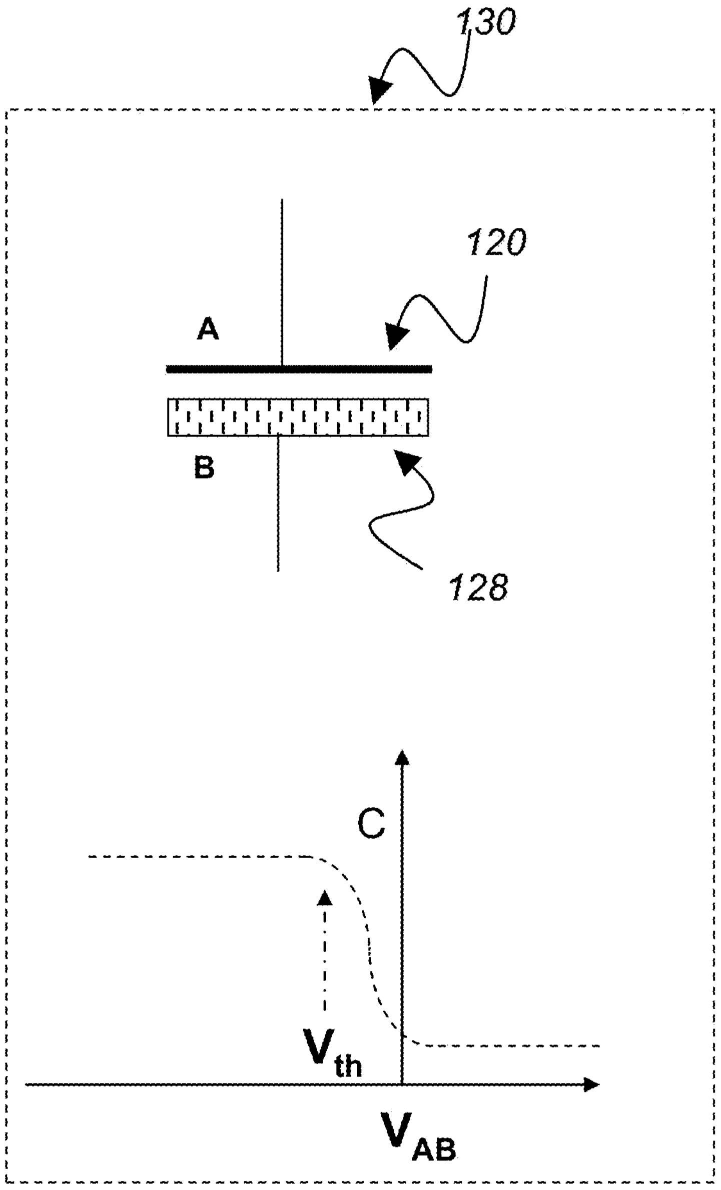
FIGURE 18: PRIOR ART

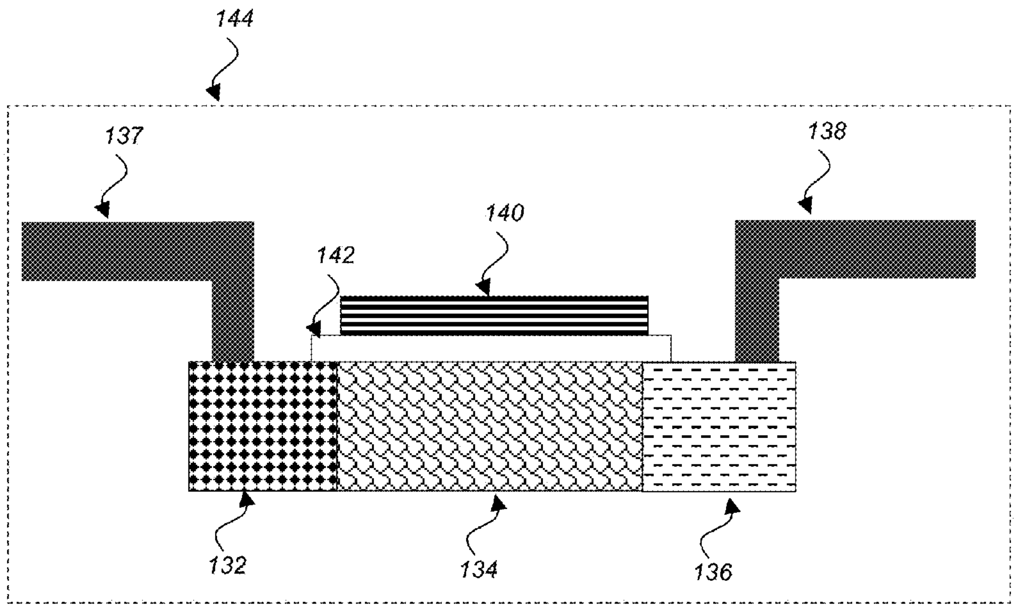
FIGURE 19: PRIOR ART
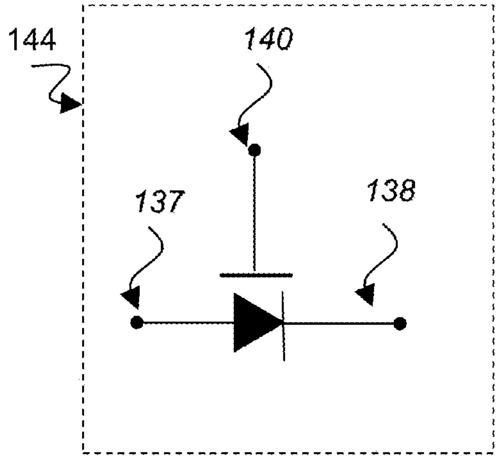
FIGURE 20: PRIOR ART

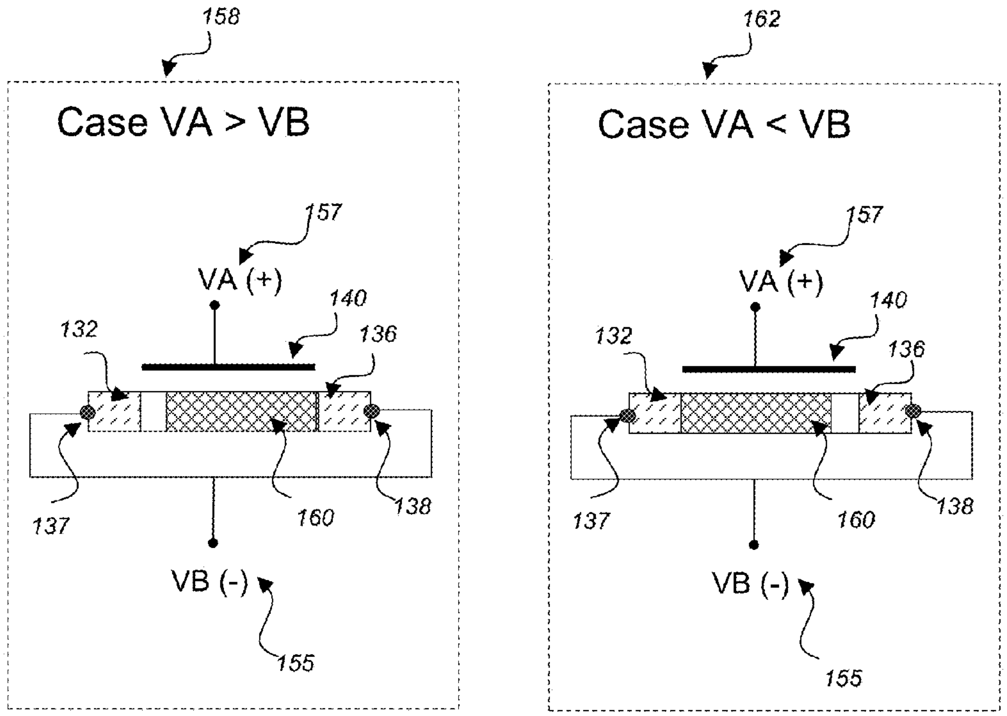
FIGURE 21: PRIOR ART

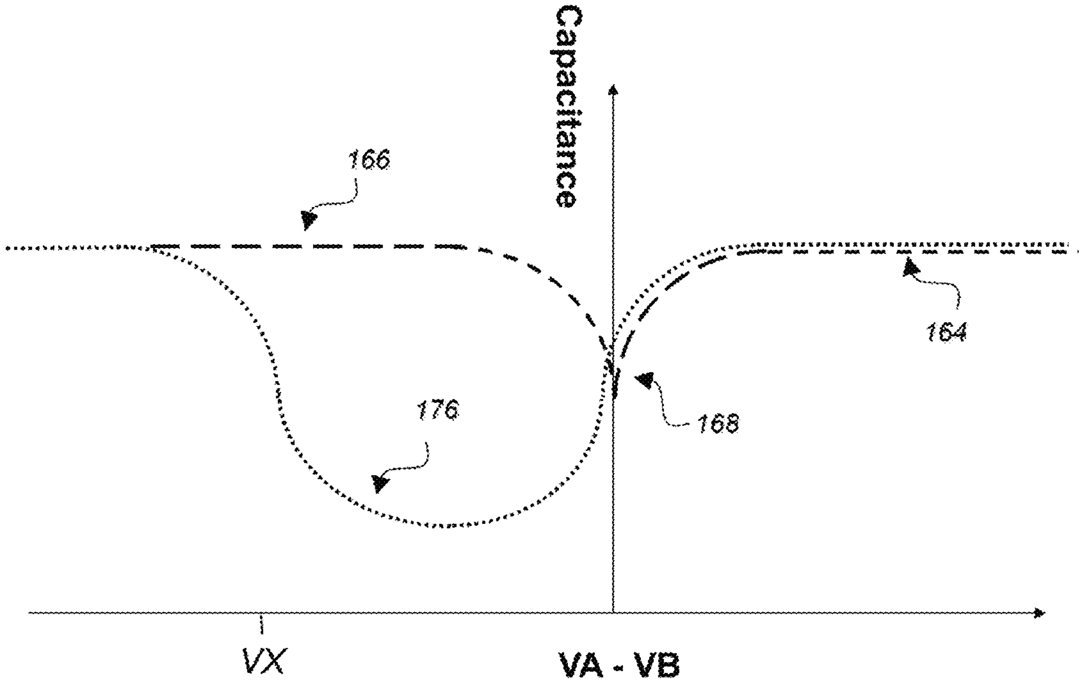
FIGURE 22: PRIOR ART

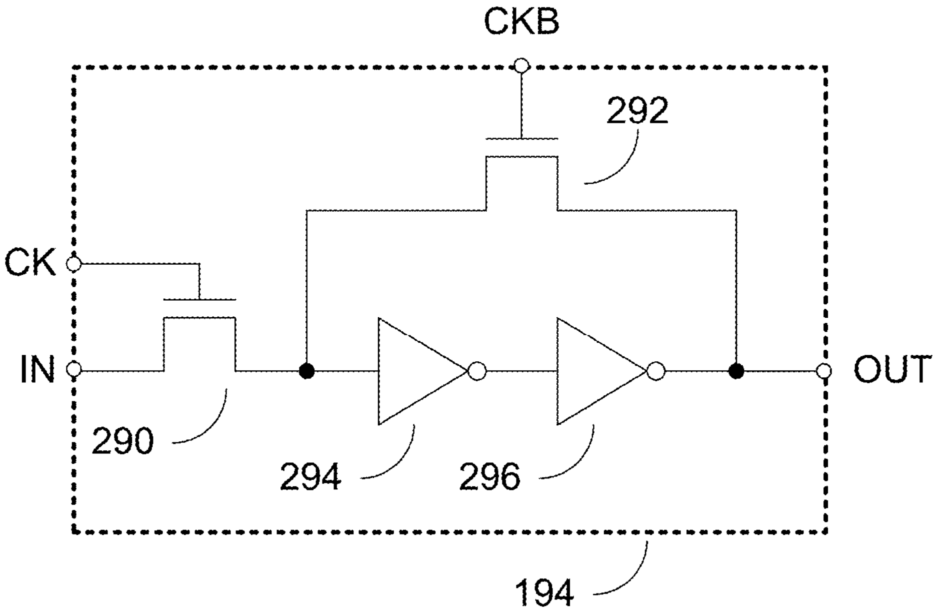
FIGURE 23: PRIOR ART

STATIC RANDOM-ACCESS CELL, ACTIVE MATRIX DEVICE AND ARRAY ELEMENT CIRCUIT

RELATED APPLICATIONS

This application is a continuation-in-part of U.S. application Ser. No. 13/176,047, filed on Jul. 5, 2011, which is a continuation-in-part of U.S. application Ser. No. 12/830,477, filed on Jul. 6, 2010, the entire disclosures of which are incorporated herein by reference.

TECHNICAL FIELD

The present invention relates to active matrix arrays and elements thereof. In a particular aspect, the present invention relates to digital microfluidics, and more specifically to AM-EWOD. Electrowetting-On-Dielectric (EWOD) is a known technique for manipulating droplets of fluid on an array. Active Matrix EWOD (AM-EWOD) refers to implementation of EWOD in an active matrix array, for example by using thin film transistors (TFTs).

BACKGROUND ART

FIG. 1 shows a liquid droplet 4 in contact with a solid surface 2 and in static equilibrium. The contact angle θ6 is defined as shown in FIG. 1, and is determined by the balancing of the surface tension components between the solid-liquid ($Y_{SL}$ 8), liquid-gas ($Y_{LG}$ 10) and solid gas ($Y_{SG}$ 12) interfaces, as shown, such that:

$$\cos\theta = \frac{\gamma_{SG} - \gamma_{SL}}{\gamma_{LG}} \quad \text{(equation 1)}$$

The contact angle θ is thus a measure of the hydrophobicity of the surface. Surfaces may be described as hydrophilic if θ<90 degrees or hydrophobic if θ>90 degrees, and as more or less hydrophobic/hydrophilic according to the difference between the contact angle and 90 degrees. FIG. 2 shows a liquid droplet 4 in static equilibrium on hydrophilic 14 and hydrophobic 16 material surfaces with respective contact angles θ6.

FIG. 3 shows the case where a droplet straddles two regions of different hydrophobicity (e.g., the hydrophobic surface 16 and the hydrophilic surface 14). In this case the situation is non-equilibrium and in order to minimise the potential energy the droplet will move laterally towards the region of greater hydrophilicity. The direction of motion is shown as 18.

If the droplet consists of an ionic material, it is well known that it is possible to change the hydrophobicity of the surface by the application of an electric field. This phenomenon is termed electrowetting. One means for implementing this is using the method of electrowetting on dielectric (EWOD), shown in FIG. 4.

A lower substrate 25 has disposed upon it a conductive electrode 22, with an insulator layer 20 deposited on top of that. The insulator layer 20 separates the conductive electrode 22 from the hydrophobic surface 16 upon which the droplet 4 sits. By applying a voltage V to the conductive electrode 22, the contact angle θ 6 can be adjusted. An advantage of manipulating contact angle θ 6 by means of EWOD is that the power consumed is low, being just that associated with charging and discharging the capacitance of the insulator layer 20.

FIG. 5 shows an alternative and improved arrangement whereby a top substrate (counter-substrate) 36 is also supplied, containing an electrode 28 coated with a hydrophobic layer 26. A voltage V2 may be applied to the electrode 28 such that the electric field at the interfaces of the liquid droplet 4 and hydrophobic layer 26 and substrate 16 is a function of the difference in potential between V2 and V. A spacer 32 may be used to fix the height of the channel layer in which the droplet 4 is constrained. In some implementations the channel volume around the droplet 4 may be filled by a non-ionic liquid, e.g. oil 34. The arrangement of FIG. 5 is advantageous compared to that of FIG. 1 for two reasons: Firstly it is possible to generate larger and better controlled electric fields at the surfaces where the liquid droplet contacts the hydrophobic layer. Secondly the liquid droplet is sealed within the device, preventing loss due to evaporation etc.

The above background art is all well known and a more detailed description can be found in standard textbooks, e.g. "Introduction to Microfluidics", Patrick Tabeling, Oxford University Press, ISBN 0-19-856864-9, section 2.8.

U.S. Pat. No. 6,565,727 (Shenderov, issued May 20, 2003) discloses a passive matrix EWOD device for moving droplets through an array. The device is constructed as shown in FIG. 6. The conductive electrode of the lower substrate 25 is patterned so that a plurality of electrodes 38 (e.g., 38A and 38B) are realised. These may be termed the EW drive elements. The term EW drive element may be taken in what follows to refer both to the electrode 38 associated with a particular array element, and also to the node of an electrical circuit directly connected to this electrode 38. By applying different voltages, termed the EW drive voltages, (e.g. V and V3) to different electrodes (e.g. drive elements 38A and 38B), the hydrophobicity of the surface can be controlled, thus enabling droplet movement to be controlled.

U.S. Pat. No. 6,911,132 (Pamula et al, issued Jun. 28, 2005) discloses an arrangement, shown in FIG. 7, whereby the conductive layer 22 on the lower substrate 25 is patterned to form a two dimensional array 42. By the application of time dependent voltage pulses to some or all of the different drive elements it is thus possible to move a liquid droplet 4 though the array on a path 44 that is determined by the sequence of the voltage pulses. U.S. Pat. No. 6,565,727 further discloses methods for other droplet operations including the splitting and merging of droplets and this mixing together of droplets of different materials. In general the voltages required to perform typical droplet operations are relatively high. Values in the range 20-60V are quoted in prior art (e.g. U.S. Pat. No. 7,329,545 (Pamula et al., issued Feb. 12, 2008), Lab on a Chip, 2002, Vol. 2, pages 96-101). The value required depends principally on the technology used to create the insulator and hydrophobic layers.

U.S. Pat. No. 7,255,780 (Shenderov, issued Aug. 14, 2007) similarly discloses a passive matrix EWOD device used for carrying out a chemical or biochemical reaction by combining droplets of different chemical constituents.

It may be noted that it is also possible, albeit generally not preferred, to implement an EWOD system to transport droplets of oil immersed in an aqueous ionic medium. The principles of operation are very similar to as already described, with the exception that the oil droplet is attracted to the regions where the conductive electrode is held at low potential.

When performing droplet operations it is in general very useful to have some means of sensing droplet position, size and constitution. This can be implemented by a number of means. For example an optical means of sensing may be implemented by observing droplet positions using a microscope. A method of optical detection using LEDs and photosensors attached to the EWOD substrate is described in Lab Chip, 2004, 4,310-315.

One particularly useful method of sensing is measuring the electrical impedance between an electrode 38 of the lower (patterned) conductive electrode 22 and the electrode 28 of the top substrate. FIG. 8 shows an approximate circuit representation 52 of the impedance in the case where a droplet 4 is present. A capacitor 46 representing the capacitance $C_i$ of the any insulator layers (including the hydrophobic layers) is in series with the impedance of the droplet 4 which can be modelled as a resistor 50 with resistance $R_{drop}$ in parallel with a capacitor 48 with capacitance $C_{drop}$. FIG. 9 shows the corresponding circuit representation 56 in the case where there is no droplet present. In this instance the impedance is that of the insulator layer capacitor 46 in series with a capacitor 54 representing the capacitance $C_{gap}$ of the cell gap. Since the overall impedance of this arrangement has no real (i.e. resistive) component, the total impedance can be represented as a frequency dependent capacitor of value $C_L$.

FIG. 10 shows schematically the dependence of $C_L$ with frequency in the cases where a droplet 4 is present (represented by dashed line 52) and where a droplet 4 is absent (represented by solid line 56). It can thus be readily appreciated that by measuring the impedance it is possible to determine whether or not a droplet 4 is present at a given node. Furthermore the value of the parameters $C_{drop}$ and $R_{drop}$ are a function of the size of the droplet 4 and the conductivity of the droplet 4. It is therefore possible to determine information relating to droplet size and droplet constitution by means of a measurement of capacitance. Sensors and Actuators B, Vol. 98 (2004) pages 319-327 describes a method for measuring droplet impedance by connecting external PCB electronics to an electrode in an EWOD array. However a disadvantage of this method is that the number of array elements at which impedance can be sensed is limited by the number of connections that can be supplied to the device. Furthermore this is not an integrated solution with external sensor electronics being required. The paper also describes how measured impedance can be used to meter the size of droplets and how droplet metering can be used to accurately control the quantities of reagents of chemical or biochemical reactions performed using an EWOD device. Impedance measurements at one or more locations could also be used for any of the following:

- Monitor the position of droplets within an array
- Determining the position of droplets within the array as a means of verifying the correct implementation of any of the previously droplet operations
- Measuring droplet impedance to determine information regarding drop constitution, e.g. conductivity.
- Measuring droplet impedance characteristics to detect or quantify a chemical or biochemical reaction.

EWOD devices have been identified as a promising platform for Lab-on-a-chip (LoaC) technology. LoaC technology is concerned with devices which seek to integrate a number of chemical or biochemical laboratory functions onto a single microscopic device. There exists a broad range of potential applications of this technology in areas such as healthcare, energy and material synthesis. Examples include bodily fluid analysis for point-of-care diagnostics, drug synthesis, proteomics, etc.

A complete LoaC system could be formed, for example, by an EWOD device to other equipment, for example a central processing unit (CPU) which could be configured to perform one or more multiple functions, for example:

- Supply voltage and timing signals to the AM-EWOD
- Analyse sensor data returned from the AM-EWOD
- Store in memory programmed data and/or sensor data
- Perform sensor calibration operations upon demand and store sensor calibration information in memory
- Process sensor data received from the AM-EWOD, including making adjustments based on saved calibration data
- Adjust and control the voltage levels and timings of sensor control signals
- Send digital or analogue data to the AM-EWOD for implementing droplet operations
- Send digital or analogue data to the AM-EWOD for implementing droplet operations whose content depends on measured sensor output data
- Adjust the voltage levels of the signals written to the EW drive electrodes in accordance with measured sensor output data.

Thin film electronics based on thin film transistors (TFTs) is a very well known technology which can be used, for example, in controlling Liquid Crystal (LC) displays. TFTs can be used to switch and hold a voltage onto a node using the standard display pixel circuit shown in FIG. 11. The pixel circuit consists of a switch transistor 68, and a storage capacitor 57. By application of voltage pulses to the source addressing line 62 and gate addressing line 64, a voltage $V_{write}$ can be written to the write node 66 and stored in the pixel. By applying a different voltage to the electrode of the counter-substrate CP 70, a voltage is thus maintained across the liquid crystal capacitance 60 within the pixel.

Many modern displays use an Active Matrix (AM) arrangement whereby a switch transistor is provided in each pixel of the display. Such displays often also incorporate integrated driver circuits to supply voltage pulses to the row and column lines (and thus program voltages to the pixels in an array). These are realised in thin film electronics and integrated onto the TFT substrate. Circuit designs for integrated display driver circuits are very well known. Further details on TFTs, display driver circuits and LC displays can be found in standard textbook, for example "Introduction to Flat Panel Displays", (Wiley Series in Display Technology, WileyBlackwell, ISBN 0470516933).

U.S. Pat. No. 7,163,612 (Sterling et al., issued Jan. 16, 2007) describes how TFT-based electronics may be used to control the addressing of voltage pulses to an EWOD array using circuit arrangements very similar to those employed in AM display technologies. FIG. 12 shows the approach taken. In contrast with the EWOD device shown in FIG. 6, the lower substrate 25 is replaced by a TFT substrate 72 having thin film electronics 74 disposed upon it. The thin film electronics 74 are used to selectively program voltages to the patterned conductive layer 22 used for controlling electrowetting. It is apparent that the thin film electronics 74 can be realised by a number of well known processing technologies, for example silicon-on-insulator (SOI), amorphous silicon on glass or low temperature polycrystalline silicon (LTPS) on glass.

Such an approach may be termed "Active Matrix Electrowetting on Dielectric" (AM-EWOD). There are several advantages in using TFT-based electronics to control an EWOD array, namely:

- Driver circuits can be integrated onto the AM-EWOD substrate. An example arrangement is shown in FIG. 13. Control of the EWOD array 42 is implemented by means of integrated row driver 76 and column driver 78 circuits. A serial interface 80 may also be provided to process a serial input data stream and write the required voltages to the array 42. The number of connecting wires 82 between the TFT substrate 72 (FIG. 12) and external drive electronics, power supplies etc. can be made relatively few, even for large array sizes.

TFT-based electronics are well suited to the AM-EWOD application. They are cheap to produce so that relatively large substrate areas can be produced at relatively low cost.

It is possible to incorporate TFT-based sensing into Active Matrix controlled arrays. For example US20080085559 (Hartzell et al., published Apr. 10, 2008) describes a TFT based active matrix bio-sensor utilising cantilever based arrays.

A further advantage of using TFT based electronics to control an AM-EWOD array is that, in general, TFTs can be designed to operate at much higher voltages than transistors fabricated in standard CMOS processes. However the large AM-EWOD programming voltages (20-60V) can in some instances still exceed the maximum voltage ratings of TFTs fabricated in standard display manufacturing processes. To some extent it is possible to modify the TFT design to be compatible with operation at higher voltages, for example by increasing the device length and/or adding Gate-Overlap-Drain (GOLD) or Lightly Doped Drain (LDD) structures. These are standard techniques for improving Metal-On-Semiconductor (MOS) device reliability which can be found described, for example, in "Hot Carrier Effects in MOS Devices", Takeda, Academic Press Inc., ISBN 0-12-682240-9, pages 40-42. However such modifications to device design may impair the TFT performance. For example, structural modifications to improve reliability may increase device self resistance and inter-terminal capacitances. The effects of this are particularly deleterious for devices which are required to operate at high speed or to perform analogue circuit functions. It is therefore desirable to restrict the use of modified high voltage devices to only those functions for which a high voltage capability is necessary, and to design driver circuits such that as few devices as possible are required to operate at the highest voltages.

Fluid manipulation by means of electrowetting is also a well known technique for realizing a display. Electronic circuits similar or identical to those used in conventional Liquid Crystal Displays (LCDs) may be used to write a voltage to an array of EW drive electrodes. Coloured droplets of liquid are located at the EW drive electrodes and move according the programmed EW drive voltage. This in turn influences the transmission of light through the structure such that the whole structure functions as a display. An overview of electrowetting display technology can be found in "Invited Paper: Electro-wetting Based Information Displays", Robert A . Hayes, SID 08 Digest pp 651-654.

In recent years there has been much interest in realising AM displays with an array based sensor function. Such devices can be used, for example as user input devices, e.g. for touch-screen applications. One such method for user interaction is described in US20060017710 (Lee et al., published Jan. 26, 2006) and shown in FIG. 14. When the surface of the device is touched, for example by means of a fingertip or a stylus 90, the liquid crystal layer 92 is compressed in the vicinity of the touch. Integrated thin film electronics 74 disposed on the TFT substrate 72 can be used to measure the change in capacitance 60 of the LC layer and thus measure the presence 84 or absence 86 of touch. If the thin film electronics 74 are of sufficient sensitivity it is also possible to measure the pressure with which the surface is touched.

U.S. Pat. No. 7,163,612 noted above also describes how TFT-based sensor circuits may be used with an AM-EWOD, e.g. to determine drop position. In the arrangement described there are two TFT substrates, the lower one being used to control the EWOD voltages, and the top substrate being used to perform a sensor function.

A number of TFT based circuit techniques for writing a voltage to a display pixel and measuring the capacitance at the pixel are known. US20060017710 discloses one such an arrangement. The circuit is arranged in two parts which are not directly connected electrically, shown FIG. 15. The operation of the voltage write portion 101 of the pixel circuit is identical to a standard display pixel circuit as has already been described in relation to FIG. 11. The operation of the sensor portion 103 of the pixel circuit is as now described. For the sensor array row being sensed, a voltage pulse is supplied to a sensor row select line RWS 104. The potential of the sense node $V_{sense}$ 102 will then increase by an amount that depends on the relative values of the LC capacitance $C_{LC2}$ 100 and the fixed reference capacitor $C_S$ 98 (and also on parasitic capacitances including those associated with the transistor 94). The potential of the sense node 102 can be measured as follows. Transistor 94 in combination with a load device (not shown) acts as standard source follower arrangement as is very well known, e.g. "CMOS Analog Circuit Design", Allen and Holberg, ISBN-10: 0195116441, section 5.3. Since the value of the capacitor $C_S$ 98 is known, measurement of column output voltage at the sensor output line COL 106 is thus a measure of the LC capacitance. A notable feature of the whole arrangement is that the write node 66 and the sense node 102 are not electrically connected. Direct connection is not necessary or desirable since detection of touch does not require the LC capacitance of the entire pixel to be measured, but instead only the capacitance of a sample portion of it.

A disadvantage of the above circuit is that there is no provision of any DC current path to the sense node 102. As a result the potential of this node may be subject to large pixel-to-pixel variations, since fixed charge at this node created during the manufacturing process may be variable from pixel-to-pixel. An improvement to this circuit is shown in FIG. 16. Here an additional diode 110 is connected to the sense node 102. The potential at the anode of the diode RST 108 is maintained such that the diode 110 is reversed biased. This potential may be taken high to forward bias the diode 110 for a brief time period before the voltage pulse is applied to the sensor row select line 104. The effect of the voltage pulse applied to reset line RST 108 is to reset the potential of the sense node 102 to an initial value which can be very well controlled. This circuit arrangement therefore has the advantage of reduced pixel-pixel variability in the measured output voltage.

In general it may be noted that in this application, both the value of the LC capacitance and the change in capacitance associated with touch are very small (of order a few fF). One consequence of this is that reference capacitor $C_S$ 98 can also be made very small (typically a few fF). The small LC capacitance also makes changes difficult to sense. British applications GB 0919260.0 (Brown, published May 11, 2011) and GB 0919261.8 (Brown, published May 11, 2011) describe means of in-pixel amplification of the small signals sensed. However in an EWOD device the capacitances presented by droplets are much larger and amplification is generally not required.

As well as implementing sensor pixel circuits onto a TFT substrate it is also well known to integrate sensor driver circuits and output amplifiers for the readout of sensor data onto the same TFT substrate, as described for example for an imager-display in "A Continuous Grain Silicon System LCD with Optical Input Function", Brown et al. IEEE Journal of Solid State Circuits, Vol. 42, Issue 12, December 2007 pp 2904-2912. The same reference also describes how calibration operations may be performed to remove fixed pattern noise from the sensor output.

There are several methods that may be used to form a capacitor circuit element in a thin film manufacturing process as would be used for example to manufacture a display. Capacitors can be formed for example using the source and gate metal layers as the plates, these layers being separated by an interlayer dielectric. In situations where it is important to keep the physical layout footprint of the capacitor it is often convenient to use a metal-oxide-semiconductor (MOS) capacitor as described in standard textbooks, e.g. Semiconductor Device Modelling for VLSI, Lee et al., Prentice-Hall, ISBN 0-13-805656-0, pages 191-193. A disadvantage of MOS capacitors is that the capacitance becomes a function of the terminal biases if the potentials are not arranged so that the channel semiconductor material is completely in accumulation. FIG. 17 shows at 124 the typical characteristics of a MOS capacitor 120 where the semiconductor material 122 is doped n-type. Plate A of the MOS capacitor 120 is formed by a conductive material (e.g. the gate metal) and plate B is the n-doped semiconductor material 122. The capacitance is shown in dotted line 126 as a function of the difference in voltage (bias voltage $V_{AB}$) between the two plates A and B. Above a certain bias voltage $V_{th}$ corresponding to approximately the threshold voltage of the n-type doped semiconductor material 122, the semiconductor material 122 is in accumulation and the capacitance is large and independent of voltage. If $V_{AB}$ is less than $V_{th}$ the capacitance becomes smaller and voltage dependent as the n-type semiconductor material 122 becomes depleted of charge carriers.

FIG. 18 at 130 shows the corresponding situation where in this case the semiconductor material 128 forming plate B of the MOS capacitor 120 is doped p-type. In this case the maximum capacitance is obtained when $V_{AB}$ is below the threshold voltage $V_{th}$ and the channel semiconductor material 128 is in accumulation.

A known lateral device type which can be realised in thin film processes is a gated P-I-N diode 144, shown FIG. 19. The gated P-I-N diode is formed from a layer of semiconductor material consisting of a p+ doped region 132, a lightly doped region 134 which may be either n-type or p-type, and an n-+ region 136. Electrical connections, e.g. with metal, are made to the p+ and n+ regions (132 and 136) to respectively form the anode terminal 137 and cathode terminal 138 of the device 144. An electrically insulating layer 142 is disposed over some or all of the lightly doped region 134, and a conductive layer forms the third gate terminal 140 of the device 144 denoted the gate terminal. Further description and explanation of the operation of such a device can be found in "High performance gated lateral polysilicon PIN diodes", Stewart and Hatalis, Solid State Electronics, Vol. 44, Issue 9, p 1613-1619. FIG. 20 shows a circuit symbol which may be used to represent the gated P-I-N diode 144 and the three connecting terminals 137, 138 and 140 corresponding to the anode, cathode, and gate, respectively.

The gated P-I-N diode 144 may be configured as a type of MOS capacitor by connecting the anode and cathode terminals together to form one terminal of the capacitor, and by using the gate terminal 140 to form the other terminal.

By connecting the gated P-I-N diode 144 in this way it functions in a similar way to the MOS capacitor as already described, with the important difference that most of the channel region remains accumulated with carriers almost regardless of the voltage between the terminals. The operation of the gated P-I-N diode 144 connected in this way is illustrated in FIG. 21. In the case represented at 158 where the voltage potential VA 157 supplied to the gate terminal 140 exceeds the voltage potential VB 155 applied to the anode terminal 137 and cathode terminal 138 (plus the channel material threshold voltage), the majority of the channel 160 (the lightly doped region 134 in FIG. 19) becomes accumulated with negatively charged carriers (electrons) supplied from the cathode terminal 138 of the gated P-I-N diode 144. The capacitance between the gate terminal 140 and the (connected together) anode terminal 137 and cathode terminal 138 then approximates to that of a MOS capacitor in accumulation. Similarly, in the case represented at 162 where VA<VB, the majority of the channel 160 becomes accumulated with positive charge carriers (holes) supplied from the anode terminal 137 of the gated P-I-N diode 144. The capacitance between the gate terminal 140 and the anode/cathode terminals 137/138 again approximates to that of a MOS capacitor in accumulation. It is also possible to form a voltage dependent capacitor from a gated P-I-N diode 144, by connecting a bias voltage to the anode terminal 137 of the device relative to the cathode terminal 138. The bias applied, −VX, should be chosen such that the gated P-I-N diode 144 remains reverse biased.

The dashed line 164, 166, 168 in FIG. 22 shows schematically the capacitance versus voltage behaviour of the gated P-I-N diode 144 when connected as shown in FIG. 21. It can be seen that at both positive 164 and negative 166 bias voltages $V_{AB}$ (where $V_{AB}$=VA−VB), the gated P-I-N diode 144 behaves like a MOS capacitor in accumulation. A small dip in the capacitance 168 appears as indicated around the threshold voltage of the material within the channel 160 (region 134 in FIG. 19). In the case represented by dotted line 176, a bias voltage−VX is applied to the anode terminal 137 relative to the cathode terminal 138. As is shown, the manner in which the capacitance varies as a function of the voltage difference between the anode terminal and the cathode terminal may be modified with application of the bias voltage−VX.

In both AM-EWOD and AM displays a number of possible alternative configurations for storing a programmed write voltage within a pixel are possible. For example a static random-access memory (SRAM) cell can be used to store the programmed voltage as is shown in FIG. 23. The SRAM cell 194 has CK and CKB clock inputs, and data input IN and a data output OUT. CK and CKB are connected to signals that are logical complements. Data is read into the cell via the IN input and transistor 290 when the CK input is high and the CKB input low; the data is passed through the two inverters 294 and 296 and presented at the output OUT. When CK is subsequently set low and CKB high transistor 292 closes a bi-stable loop such that the two inverters 294 and 296 retain the data.

An alternative technology for implementing droplet microfluidics is dielectrophoresis. Dielectrophoresis is a phenomenon whereby a force may be exerted on a dielectric particle by subjecting it to a varying electric field. An introduction may be found in "Introduction to Microfluidics", Patrick Tabeling, Oxford University Press (January 2006), ISBN 0-19-856864-9, pages 211-214. "Integrated circuit/microfluidic chip to programmably trap and move cells and droplets with dielectrophoresis", Thomas P Hunt et al, Lab Chip, 2008,8,81-87 describes a silicon integrated circuit (IC) backplane to drive a dielectropheresis array for digital microfluidics. This reference also includes an array-based integrated circuit for supplying drive waveforms to array elements.

SUMMARY OF INVENTION

The invention relates to an AM-EWOD device with an array based integrated impedance sensor for sensing the location, size and constitution of ionic droplets. The preferred pixel circuit architecture utilises an AC coupled arrangement to write the EW drive voltage to the EW drive element and sense the impedance at the EW drive element.

The advantages of including an impedance sensor capability in an AM-EWOD device are as follows:

- By measuring impedance at each array element in the AM-EWOD array it is possible to determine the location of droplets with the array.
- By measuring the impedance of a given droplet, it is possible to determine the size of the droplet. An impedance sensor capability can thus be used for metering quantities of fluids used in chemical and/or biochemical reactions.
- By measuring impedance at each array element it is possible to verify the correct execution of fluidic protocols, e.g. drop moving, drop splitting, drop actuation from a reservoir.
- By use of circuit based techniques it is possible to determine information regarding droplet constitution, e.g. resistivity.

The advantages of integrating an impedance sensor capability into the AM-EWOD drive electronics are as follows:

- By employing an active-matrix sensor arrangement, the impedance can be measured at a large number of points in an array almost simultaneously.
- By integrating sensor drive circuitry and output amplifiers into the AM-EWOD drive electronics, the impedance can be measured at a large number of points in an array with only a small number of connections being required to be made between the AM-EWOD device and external drive electronics. This improves manufacturability and minimises cost compared to a passive matrix sensor arrangement, as in the prior art, where the impedance at each location in the array has to be connected individually.
- An integrated impedance sensor capability requires few or no additional process steps or assembly cost in comparison to a standard AM-EWOD device.

The advantages of the AC coupled arrangement disclosed in the preferred embodiments for writing an EW drive voltage to the EW drive element and sensing the impedance at the EW drive element are as follows:

- Only certain less performance-critical circuit components are required to withstand high voltages such as are required for the EW-drive voltage. This reduces layout footprint, improves reliability and improves circuit performance.
- The sensor circuit can be arranged such that performing the sense operation does not destroy the EW-drive voltage written to the EW-drive element, and only disturbs it for a limited time during the sense operation
- The sensor circuit can be arranged such that the EW-drive voltage written to the EW-drive element is not degraded by any DC leakage paths through the sensor components added to the array element circuit.

According to an aspect of the invention, a static random-access memory (SRAM) cell is provided which includes: a sampling switch and a feedback switch; and a first inverter and a second inverter connected in series whereby an output of the first inverter is connected to an input of the second inverter. An input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

According to another aspect, the SRAM cell further includes timing circuitry configured to switch the sampling switch and feedback switch at different times with respect to each other during a predefined operation.

In accordance with another aspect of the invention, an active-matrix device is provided which includes a plurality of array element circuits arranged in rows and columns; a plurality of source addressing lines each shared between the array element circuits in corresponding same columns; a plurality of gate addressing lines each shared between the array element circuits in corresponding same rows; and a plurality of sensor row select lines each shared between the array element circuits in corresponding same rows. Each of the plurality of array element circuits includes an array element which is controlled by application of a drive voltage by a drive element; writing circuitry for writing the drive voltage to the drive element, the writing circuitry being coupled to a corresponding source addressing line and gate addressing line among the plurality of source addressing lines and gate addressing lines, and including a static random-access memory (SRAM) cell for storing the drive voltage which is written to the drive element; and sense circuitry for sensing an impedance presented at the drive element, the sense circuitry being coupled to a corresponding sensor row select line.

According to another aspect, the SRAM cell includes a sampling switch and a feedback switch; and a first inverter and a second inverter connected in series whereby an output of the first inverter is connected to an input of the second inverter, wherein an input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

In accordance with another aspect, the data input of the SRAM cell is connected to the corresponding source addressing line and the data output of the SRAM cell is connected to the corresponding drive element.

According to yet another aspect, the active-matrix device includes timing circuitry configured to switch the sampling switch and feedback switch within a given one of the SRAM cells at different times with respect to each other during a predefined operation.

According to another aspect, as part of a write operation in order to write the drive voltage to a drive element via the corresponding SRAM cell, the timing circuitry is configured to effect: (a) turning on the sampling switch to connect the data at the data input to the drive element; (b) turning on the feedback switch to effect a closed loop which holds the data at the drive element; and (c) subsequent to (a) and (b), turning off the sampling switch to disconnect the input of the first inverter from the data input.

In accordance with still another aspect, the predefined operation is a sensor operation following the write operation, and as part of the sensor operation the timing circuitry is configured to: (d) while the sampling switch remains off following (c), turn off the feedback switch to effect an open loop whereafter the sense circuitry senses the impedance presented at the drive element.

According to still another aspect, as part of the sensor operation the timing circuitry is configured to: (e) subsequent to (d) and while the sampling switch remains off following (c), turn on the feedback switch to effect the closed loop which holds the data at the drive element.

According to yet another aspect, the sampling switches of the respective SRAM cells are controlled by a clock signal on the corresponding gate addressing line.

In accordance with another aspect, the feedback switches of the respective SRAM cells are controlled by a clock signal on a corresponding sensor enable line.

In yet another aspect, the corresponding sensor enable line is shared between all of the array element circuits in corresponding same rows.

According to another aspect, the corresponding enable line is shared among all the plurality of array element circuits.

In accordance with yet another aspect, the SRAM cells each include only the sampling switch and the feedback switch insofar as switches, and clock signals provided to the sampling switch and the feedback switch are not complementary.

According to still another aspect, the array elements are hydrophobic cells having a surface of which the hydrophobicity is controlled by the application of the drive voltage by the corresponding drive element, and the corresponding sense circuitry senses the impedance presented at the drive element by the hydrophobic cell.

According to another aspect, with respect to each of the plurality of array element circuits: the writing circuitry is configured to perturb the drive voltage written to the drive element; the sense circuitry is configured sense a result of the perturbation of the drive voltage written to the drive element, the result of the perturbation being dependent upon the impedance presented at the drive element; and the sense circuitry includes an output for producing an output signal a value of which represents the impedance presented at the drive element.

According to still another aspect, the active-matrix device includes a plurality of sensor output lines each shared between the array element circuits in corresponding same columns, and the outputs of the plurality of array element circuits are coupled to a corresponding sensor output line.

In accordance with still another aspect of the invention, a device having an array element circuit with an integrated impedance sensor is provided, including: an array element which is controlled by application of a drive voltage by a drive element; writing circuitry for writing the drive voltage to the drive element, the writing circuitry comprising a static random-access memory (SRAM) cell; and sense circuitry for sensing an impedance presented at the drive element.

According to another aspect, the SRAM cell includes: a sampling switch and a feedback switch; and a first inverter and a second inverter connected in series whereby an output of the first inverter is connected to an input of the second inverter. An input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

According to another aspect, the data input of the SRAM cell is connected to the corresponding source addressing line and the data output of the SRAM cell is connected to the corresponding drive element.

In accordance with still another aspect, the array element is a hydrophobic cell having a surface of which the hydrophobicity is controlled by the application of the drive voltage by the drive element, and the sense circuitry senses the impedance presented at the drive element by the hydrophobic cell.

According to still another aspect, the writing circuitry is configured to perturb the drive voltage written to the drive element; the sense circuitry is configured to sense a result of the perturbation of the drive voltage written to the drive element, the result of the perturbation being dependent upon the impedance presented at the drive element; and the sense circuitry includes an output for producing an output signal a value of which represents the impedance presented at the drive element.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

The present invention integrates sensor drive circuitry and output amplifiers into the AM-EWOD drive electronics, allowing the impedance to be measured at a large number of points in an array with only a small number of connections being required to be made between the AM-EWOD device and external drive electronics.

BRIEF DESCRIPTION OF DRAWINGS

In the annexed drawings, like references indicate like parts or features:

FIG. 1 shows prior art: the disposition of a droplet on a surface illustrating surface tensions and defining contact angle.

FIG. 2 shows prior art: the disposition of a droplet on hydrophobic and hydrophilic surfaces.

FIG. 3 shows prior art: the motion of a droplet on a surface that is partially hydrophobic and partially hydrophilic.

FIG. 4 shows prior art: an arrangement for implementing electrowetting-on-dielectric (EWOD).

FIG. 5 shows prior art: an improved arrangement for implementing electrowetting-on-dielectric using top and bottom substrates.

FIG. 6 shows prior art: a passive matrix EWOD device.

FIG. 7 shows prior art: lateral droplet movement through an EWOD device.

FIG. 8 shows prior art: a model for the impedance presented between an EWOD drive electrode and the conductive layer of the top substrate when a droplet is present.

FIG. 9 shows prior art: a model for the impedance presented between an EWOD drive electrode and the conductive layer of the top substrate when a droplet is absent.

FIG. 10 shows prior art: a graph of the imaginary component of the impedance as a function of frequency with a droplet present and with a droplet absent.

FIG. 11 shows prior art: the standard display pixel circuit.

FIG. 12 shows prior art: an active matrix EWOD device.

FIG. 13 shows prior art: an example AM-EWOD driver circuit arrangement.

FIG. 14 shows prior art: a touch input LC display device detecting touch by sensing the LC capacitance.

FIG. 15 shows prior art: a pixel circuit of an LC display having a capacitance sensor touch input capability.

FIG. 16 shows prior art: a pixel circuit of another LC display having a capacitance sensor touch input capability.

FIG. 17 shows prior art: the construction and operation of a MOS capacitor device where the semiconductor material is doped n-type.

FIG. 18 shows prior art: the construction and operation of a MOS capacitor device where the semiconductor material is doped p-type.

FIG. 19 shows prior art: a lateral gated P-I-N diode.

FIG. 20 shows prior art: a circuit symbol for a lateral gated diode.

FIG. 21 shows prior art: the operation of a gated diode connected such that the anode and cathode potentials are common, as utilised in a second embodiment of the invention.

FIG. 22 shows prior art: the capacitance versus voltage characteristic of the gated diode connected such that the anode and cathode potentials are common and when a potential difference–VX is applied between the anode and cathode terminals.

FIG. 23 shows prior art: a standard SRAM cell.

Figure 24:
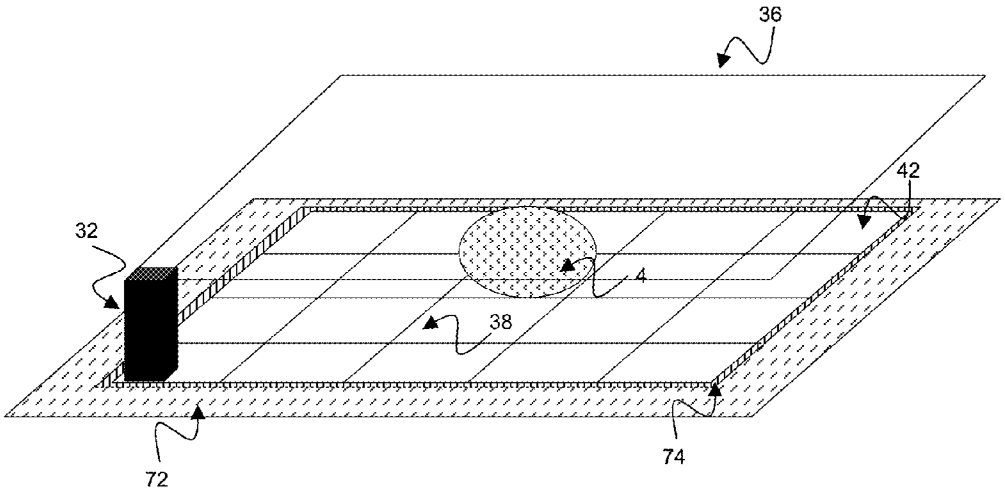
FIG. 24 shows a first embodiment of the invention.

| DESCRIPTION OF REFERENCE NUMERALS | |
|---|---|
| 2 | solid surface |
| 4 | liquid droplet |
| 6 | contact angle theta |
| 8 | Solid-liquid interface surface tension |
| 10 | Liquid-gas interface surface tension |
| 12 | Solid-gas interface surface tension |
| 14 | Hydrophilic surface |
| 16 | Hydrophobic surface |
| 18 | Direction of motion of a droplet on a surface |
| 20 | Insulator layer |
| 22 | Conductive electrode |
| 25 | Lower substrate |
| 26 | Hydrophobic layer |
| 28 | Electrode (top substrate) |
| 32 | Spacer |
| 34 | Non ionic liquid (oil) |
| 36 | counter-substrate |
| 38 | Electrode-bottom substrate (Multiple electrodes (38A and 38B)) |
| 42 | Two-dimensional array of electrodes |
| 44 | Path of droplet movement |
| 46 | Capacitance of insulator layers (Ci) |
| 47 | Intermediate node |
| 48 | Capacitive component of drop impedance $C_{drop}$ |
| 50 | Resistive component of drop impedance $R_{drop}$ |
| 52 | Impedance when droplet present |
| 54 | Capacitor representing cell gap capacitance $C_{gap}$ |
| 56 | Impedance when droplet absent |
| 57 | Storage capacitor of display pixel circuit Cstore |
| 58 | Capacitor Cs |
| 60 | Liquid crystal capacitance |
| 62 | Source addressing line |
| 64 | Gate addressing line |
| 65 | GateB complement addressing line |
| 66 | Write node |
| 68 | Switch transistor of display circuit/ used equivalently in the invention |
| 70 | Counter substrate CP |
| 72 | TFT substrate |
| 74 | Thin film electronics |
| 76 | Row driver |
| 78 | Integrated column driver |
| 79 | Column output circuit |
| 80 | Serial interface |
| 82 | Connecting wires |
| 84 | LC capacitance being touched |
| 85 | Array element circuit |
| 86 | LC capacitance not being touched |
| 90 | Fingertip or stylus |
| 92 | Liquid crystal layer |
| 94 | Transistor |
| 98 | Reference capacitor Cs |
| 100 | LC capacitance 2 |
| 102 | Sense node |
| 104 | Sensor row select line RWS |
| 106 | Sensor output line COL |
| 108 | Reset line RST |
| 110 | Diode |
| 120 | MOS capacitor |
| 122 | semiconductor material |
| 124 | Characteristics of a MOS capacitor |
| 126 | Capacitance of MOS capacitor (n-type) |
| 128 | semiconductor material |
| 130 | Characteristics of MOS capacitor (p-type) |
| 132 | p+ region |
| 134 | Lightly doped region |
| 136 | n+ region |
| 137 | Anode terminal |
| 138 | Cathode terminal |
| 140 | Gate terminal |
| 142 | Electrically insulating layer |
| 144 | Gated P-I-N diode |
| 146 | Coupling capacitor Cc |
| 148 | Diode |
| 150 | Power supply VDD |
| 152 | EW drive electrode |
| 154 | Capacitive load element |
| 155 | Voltage potential VB |

-continued

| DESCRIPTION OF REFERENCE NUMERALS | |
|---|---|
| 157 | Voltage potential VA |
| 158 | Gated diode operation where VA > VB |
| 160 | Channel of gated diode device |
| 162 | Gated diode operation where VB > VA |
| 164 | Positive bias voltage Vab |
| 166 | Negative bias voltage Vab |
| 168 | Dip in gated diode capacitance (dashed line) |
| 170 | Dual purpose RST/RWS line |
| 172 | Bias supply VBR |
| 176 | Dotted line showing gated diode capacitance at a reverse bias voltage |
| 180 | Row select pulse train (multiple pulses) |
| 182 | Row select pulse train (single pulse) |
| 184 | Power supply line VSS |
| 186 | p type Transistor T3 |
| 188 | Diode |
| 190 | Capacitor Cs |
| 192 | Capacitor Cp |
| 194 | SRAM cell |
| 196 | Transistor 68 |
| 198 | Sensor enable line SEN |
| 200 | Reset line RSTB |
| 202 | Diode |
| 204 | RWS/RSTB line |
| 205 | Transistor |
| 206 | Transistor |
| 208 | Power supply line VRST |
| 210 | Modified SRAM cell |
| 212 | Transistor |
| 214 | Logical inverter |
| 216 | Logical inverter |
| 218 | Transistor |
| 290 | Transistor |
| 292 | Transistor |
| 294 | Logical inverter |
| 296 | Logical inverter |
| 302 | Pixel of sensor output image |
| 306 | Row driver |
| 308 | Column driver |
| 310 | Row data written |
| 312 | Row data not written |
| 314 | Portion of array sensed |
| 316 | Portion of array not sensed |
| 318 | Computer |
| 320 | Sensor timing schematic |
| 322 | Calibration timing schematic |

DETAILED DESCRIPTION OF INVENTION

Referring to FIG. 24, shown is a droplet microfluidic device in accordance with an exemplary embodiment of the present invention. The droplet microfluidic device is an active matrix device with the capability of manipulating fluids by EWOD and of sensing the droplet impedance at each array element.

The droplet microfluidic device has a lower substrate 72 with thin film electronics 74 disposed upon the substrate 72. The thin film electronics 74 are arranged to drive array element electrodes, e.g. 38. A plurality of array element electrodes 38 are arranged in an electrode array 42, having M×N elements where M and N may be any number. A liquid droplet 4 is enclosed between the substrate 72 and the top substrate 36, although it will be appreciated that multiple droplets 4 can be present without departing from the scope of the invention.

Figure 25:
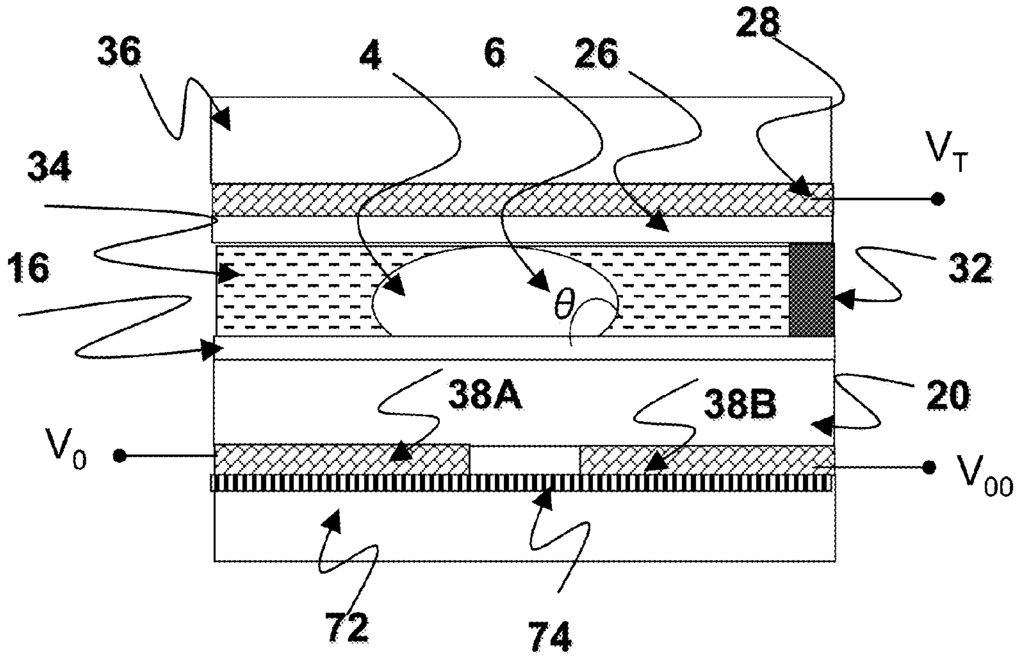
FIG. 25 shows a first embodiment of the invention

FIG. 25 shows a pair of the array elements in cross section. The device includes the lower substrate 72 having the thin-film electronics 74 disposed thereon. The uppermost layer of the lower substrate 72 (which may be considered a part of the thin film electronics layer 74) is patterned so that a plurality of electrodes 38 (e.g., 38A and 38B in FIG. 25) are realised. These may be termed the EW drive elements. The term EW drive element may be taken in what follows to refer both to the electrode 38 associated with a particular array element, and also to the node of an electrical circuit directly connected to this electrode 38. The droplet 4, consisting of an ionic material is constrained in a plane between the lower substrate 72 and the top substrate 36. A suitable gap between the two substrates may be realised by means of a spacer 32, and a non-ionic liquid 34 (e.g. oil) may be used to occupy the volume not occupied by the droplet 4. An insulator layer 20 disposed upon the lower substrate 72 separates the conductive electrodes 38A, 38B from the hydrophobic surface 16 upon which the droplet 4 sits with a contact angle 6 represented by θ. On the top substrate 36 is another hydrophobic layer 26 with which the droplet 4 may come into contact. Interposed between the top substrate 36 and the hydrophobic layer 26 is a top substrate electrode 28. By appropriate design and operation of the thin film electronics 74, different voltages, termed the EW drive voltages, (e.g. $V_T$, $V_0$ and $V_{00}$) may be applied to different electrodes (e.g. drive element electrodes 28, 38A and 38B, respectively). The hydrophobicity of the hydrophobic surface 16 can be thus be controlled, thus facilitating droplet movement in the lateral plane between the two substrates 72 and 36.

Figure 26:
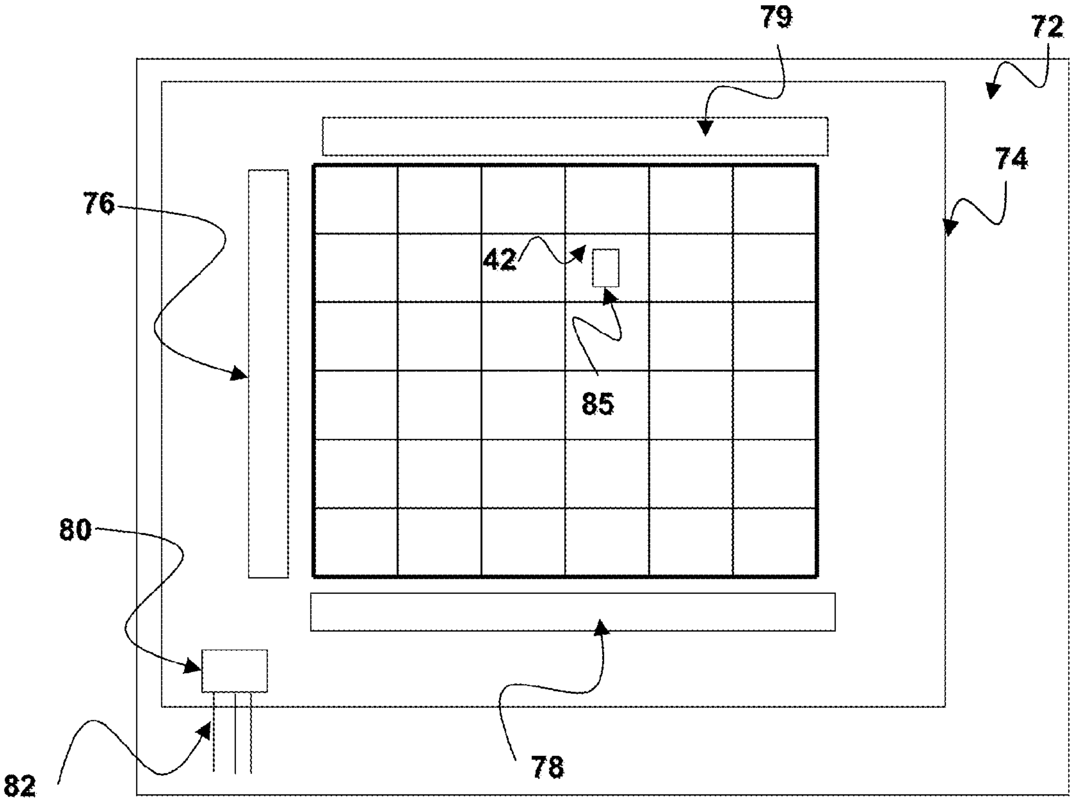
FIG. 26 shows a cross section of the device of a first embodiment

The arrangement of thin film electronics 74 upon the substrate 72 is shown in FIG. 26. This differs from the arrangement shown in prior art FIG. 13 in the following regards:

- An array element circuit 85 additionally contains a function for measuring the impedance presented at that array element.
- The integrated row driver 76 and column driver 78 circuits are also configured to supply voltage signals to the array element circuit 85 for controlling the operation of the impedance sensor function
- A column output circuit 79 is provided for measuring the output voltage from the impedance sensor function of the array element circuit 85

The serial interface 80 may contain additional control signals for controlling the operation of the impedance sensor function, and also contains an additional output line, for outputting measured impedance sensor data.

Figure 27:
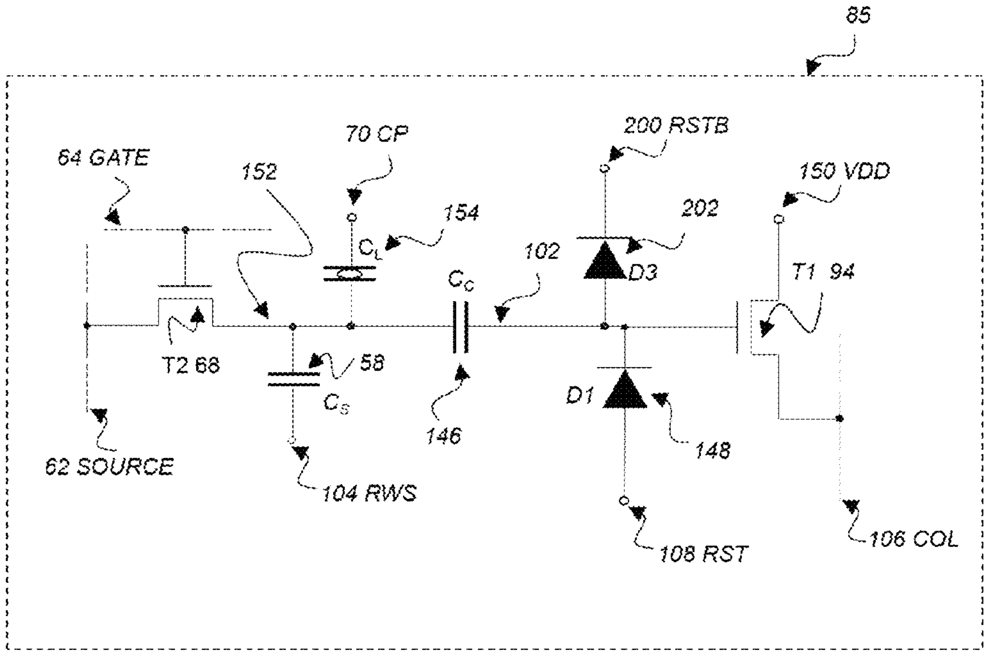
FIG. 27 shows the circuit schematic of the array element circuit according to a first embodiment of the invention

According to a first embodiment of the invention, shown in FIG. 27 is an array element circuit 85 for the AM-EWOD device, which incorporates an integrated impedance sensor. As with each of the embodiments of the invention described herein, a plurality of the described array elements are included in an AM display in an array of rows and columns with corresponding driver circuits similar to FIG. 13. Accordingly, additional detail regarding the otherwise conventional portions of the display have been omitted for sake of brevity.

Referring again to FIG. 27, the array element circuit 85 includes the following elements:

- A switch transistor 68
- A storage capacitor $C_S$ 58
- A coupling capacitor $C_C$ 146
- A diode 148
- A diode 202
- A transistor 94

Connections supplied to the array element circuit 85 are as follows:

- A source addressing line 62 which is shared between array element circuits 85 in the same column
- A gate addressing line 64 which is shared between array element circuits 85 in the same row
- A sensor row select line RWS 104 which is shared between array element circuits 85 in the same row
- A reset line RST 108 which is shared between array element circuit 85 in the same row A second reset line RSTB 200 which is shared between array element circuits 85 in the same row A power supply line VDD 150 which is common to all array element circuits 85 in the array A sensor output line COL 106 which is shared between array element circuits 85 in the same column Each array element contains an EW drive electrode 152 to which a voltage $V_{WRITE}$ can be programmed. Also shown is a load element represented by capacitor $C_L$ 154. The capacitor $C_L$ 154 specifically represents the impedance between the EW drive electrode 152 and the counter-substrate 36, and thus represents the impedance presented by the hydrophobic cell with hydrophobic surface included in the array element. The value of capacitor $C_L$ 154 is dependent on the presence of, size of and constitution of any liquid droplet located at the hydrophobic cell within that particular array element within the array.

The circuit is connected as follows:

The source addressing line 62 is connected to the drain of transistor 68. The gate addressing line 64 is connected to the gate of transistor 68. The source of transistor 68 is connected to the EW drive electrode 152. The source addressing line 62, transistor 68, gate addressing line 64 and storage capacitor $C_S$ 58 make up writing circuitry for writing a drive voltage to the EW drive electrode 152 as will be further described herein. Capacitor $C_S$ 58 is connected between the EW drive electrode 152 and the sensor row select line RWS 104. Coupling capacitor $C_C$ 146 is connected between the EW drive electrode 152 and the gate of transistor 94. The anode of the diode 148 is connected to the reset line 108. The cathode of the diode 148 is connected to the gate of transistor 94 and to the anode of diode 202. The cathode of diode 202 is connected to the reset line RSTB 200. The drain of transistor 94 is connected to the VDD power supply line 150. The source of transistor 94 is connected to the sensor output line COL 106 shared between the array element circuits 85 of the same column.

The operation of the circuit is as follows:

In operation the circuit performs two basic functions, namely (i) writing a voltage to the drive element comprising the EW drive electrode 152 so as to control the hydrophobicity of the hydrophobic cell within the array element; and (ii) sensing the impedance presented by the hydrophobic cell at the drive element including the EW drive electrode 152.

In order to write a voltage, the required write voltage $V_{WRITE}$ is programmed onto the source addressing line 62 via the column driver (e.g., 78 in FIG. 26). The write voltage $V_{WRITE}$ can be based on the voltage pattern to be written, for droplet control for example, or some other voltage such as for purposes of testing, calibration, etc., as will be appreciated. The gate addressing line 64 is then taken to a high voltage via the row driver (e.g., 76 in FIG. 26) such that transistor 68 is switched on. The voltage $V_{WRITE}$ is then written to the EW drive electrode 152 and stored on the capacitance present at this node, and in particular on storage capacitor $C_S$ 58 (which in general is substantially larger in capacitance value than coupling capacitor $C_C$ 146). The gate addressing line 64 is then taken to a low level via the row driver to turn off transistor 68 and complete the write operation. It may be noted that the switch transistor 68 in combination with the storage capacitor 58 function in effect as a Dynamic Random Access Memory (DRAM) cell as is very well known; voltage $V_{WRITE}$ written to the EW drive electrode 152 is stored on the storage capacitor 58. The switch transistor 68 will be non-ideal to at least some extent in that when the switch transistor 68 is turned off there will be some quantity of parasitic leakage current between its source and drain terminals. This may result in the voltage written to EW drive electrode 152 changing over time. Consequently it may be found to be necessary to re-write the voltage of the EW drive electrode 152 periodically, the frequency with which refresh is required being in accordance with the quantity of parasitic leakage current through the switch transistor 68 and the size of capacitor 58.

In order to sense the impedance presented at the EW drive electrode 152 following the writing of the voltage $V_{WRITE}$, the sense node 102 is first reset.

Specifically, sense circuitry included within the control circuitry includes reset circuitry which performs the reset operation. The reset circuitry includes, for example, the diodes 148 and 202 connected in series with sense node 102 therebetween. As noted above, the opposite ends of the diodes 148 and 202 are connected to the reset lines RST 108 and RSTB 200, respectively. The reset operation, if performed, occurs by taking the reset line RST 108 to its logic high level, and the reset line RSTB 200 to its logic low level. The voltage levels of the reset lines RST 108 and RSTB 200 are arranged so that the logic low level of reset line RSTB 200 and the logic high level of the reset line RST 108 are identical, a value VRST. The value VRST is chosen so as to be sufficient to ensure that transistor 94 is turned off at this voltage. When the reset operation is effected, one of diodes 148 or 202 is forward biased, and so the sense node 102 is charged/discharged to the voltage level VRST. Following the completion of the reset operation, the reset line RST 108 is taken to its logic low level and the reset line RSTB 200 to its logic high level. The voltage levels of the reset line RST 108 low logic level and reset line RSTB 200 high logic level are each arranged so as to be sufficient to keep both diodes 148 and 202 reversed biased for the remainder of the sense operation.

The sense circuitry in the array element circuit 85 of FIG. 27 includes the sensor row select line RWS 104, coupling capacitor $C_C$, transistor 94 and sensor output line COL 106. In order to sense the impedance presented at the drive element by the hydrophobic cell in the array element, a voltage pulse of amplitude ΔVRWS is then applied to the sensor row select line RWS 104. The pulse is coupled to the EW drive electrode 152 via the storage capacitor $C_S$. Since transistor 68 is turned off the voltage $V_{WRITE}$ at the EW drive electrode 152 is then perturbed by an amount ($\Delta V_{WRITE}$) that is proportional to ΔVRWS and also depends on the magnitude of the voltage pulse on sensor row select line RWS 104 and the relative values of the capacitors $C_C$, $C_S$ and $C_L$ (and also parasitic capacitances of transistors 94 and 68 and diodes 148 and 202). In the assumption that the parasitic components are small the drive voltage $V_{WRITE}$ is perturbed so as to be given by the new value $V_{WRITE}'$ $$V_{WRITE}'=V_{WRITE}+\Delta V_{WRITE} \quad \text{(equation 2a)}$$

Where the perturbation $\Delta V_{WRITE}$ is given by:

$$\Delta V_{WRITE}=\Delta VRWS\times\frac{C_S}{C_{TOTAL}} \quad \text{(equation 2b)}$$

Where $$C_{TOTAL}=C_S+C_C+C_L \quad \text{(equation 3)}$$

In general the capacitive components are sized such that storage capacitor $C_S$ is of similar order in value to the load impedance as represented by capacitor $C_L$ in the case when a droplet is present, and such that the storage capacitor $C_S$ is 1-2 orders of magnitude larger in value than the coupling capacitor $C_C$. The perturbation $\Delta V_{WRITE}$ in the voltage of the EW drive electrode 152 due to the pulse ΔVRWS on the sensor row select line RWS 104 then also results in a perturbation $\Delta V_{SENSE}$ of the potential at the sense node 102 due to the effects of the coupling capacitor $C_C$. The perturbation $\Delta V_{SENSE}$ in potential at the sense node 102 is given approximately by $$\Delta V_{SENSE} = \Delta V_{WRITE} \times \frac{C_C}{C_C + C_{DIODE} + C_T}$$

where $C_{DIODE}$ represents the capacitance presented by diode 148 and $C_T$ represents the parasitic capacitance of transistor 94. In general the circuit is designed so that the coupling capacitor $C_C$ is larger than the parasitic capacitances $C_{DIODE}$ and $C_T$. As a result the perturbation $\Delta V_{SENSE}$ of the voltage at the sense node 102 is in general similar to the perturbation $\Delta V_{WRITE}$ of the write node voltage at the EW drive electrode 152 (though this is not necessarily required to be the case). Capacitor $C_S$ has a dual function; it functions as a storage capacitor, storing an electrowetting voltage is written to the array element. It also functions as a reference capacitor when sensing impedance; the impedance is measured essentially by comparing $C_S$ to the droplet capacitance $C_{drop}$.

The overall result of pulsing the sensor row select line RWS 104 is that the voltage potential at the sense node 102 is perturbed by an amount $\Delta V_{SENSE}$ that depends on the impedance represented by capacitor $C_L$ (which again is dependent on the presence of, size of and constitution of any droplet located at the particular array element) for the duration of the RWS pulse. As a result the transistor 94 may be switched on to some extent during the RWS operation in which the RWS pulse is applied to the sensor row select line RWS104. The sensor output line COL 106 is loaded by a suitable biasing element which forms part of the column output circuit 70 (e.g. a resistor or a transistor, not shown), which may be common to each array element in the same column. Transistor 94 thus operates as a source follower and the output voltage appearing at the sensor output line COL 106 during the row select operation is a function of the impedance represented by capacitor $C_L$. This voltage may then be sampled and read out by a second stage amplifier contained within the column output circuit 70. Such a circuit may be realised using well known techniques, as for example described for an imager-display as referenced in the prior art section. The array element circuit 85 of FIG. 27 thus acts to sense and measure the value of $C_L$. By selective addressing of the reset lines RST 108 and RSTB 200, the sensor row select line RWS 104, and the sampling of the output on the sensor output line COL 106, the impedance represented by the capacitor $C_L$ can be measured at each element within an array. The measured impedance in turn represents the presence of, size and constitution of any droplet located at the particular element within the array.

It may be noted that following the sense operation when the voltage on the sensor row select line RWS 104 is returned to its original value, the potential of the EW drive electrode 152 returns to substantially the same value as prior to the sense operation. In this regard the sensor operation is non-destructive; indeed any voltage written to the EW drive electrode 152 is only disturbed for the duration of the RWS pulse on the sensor row select line RWS 104 (which is typically only for a few microseconds, for example). It may also be noted that in this arrangement there is no additional DC leakage path introduced to the EW drive electrode 152.

It may also be noted that it is not in all cases necessary to perform the reset operation using reset lines RST 108 and RSTB 200 at the start of every sense operation. In some instances it may be adequate and/or preferable to reset the sense node 102 on a more occasional basis. For example, if a series of sensor measurements are to be made a single reset operation could be performed before making the first measurement but with no reset performed between measurements. This may be advantageous because the potential at the sense node 102 immediately prior to each measurement would not be subject to variability due to the imperfections of the reset operation. Variability in the reset level could be affected by factors such as ambient illumination and temperature which may be subject to variations during the course of the measurements.

According to the operation of this embodiment, the AM-EWOD device may be used to manipulate liquid droplets on the hydrophobic surface, in accordance with the pattern of voltage written the array of EW drive electrodes 152 and the variation of this pattern with time. For example the successive frames in time of write data may be written to the array to manipulate one or more liquid droplets 4, for example to perform the operations, of moving droplets, merging droplets, splitting droplets, etc. as is well known for EWOD technology and described in prior art. The AM-EWOD device may also be used to sense the impedance presented by any liquid droplets present at each location in the array by operation of the sensor function. By operation of the sensor function at any given moment in time, the impedance present at each element within the array is measured, giving an output image of the measured impedance data and its spatial variation throughout the array.

The output image of measured impedance sensor data may be utilized in multiple different ways, for example 1. The image of impedance data may be used to determine the spatial positions of liquid droplets 4 within the array.
2. The image of impedance data may be used to determine the size (or volume) of liquid droplets 4 within the array According to utilization 1 above, it is advantageous to be able to sense and determine the spatial positions of liquid droplets as a means of verifying that the liquid droplet operations that have been written (which may, for example, be the movement of a droplet) have in fact been correctly implemented, and that the liquid droplets are in fact located at their intended positions within the array. The provision of such a checking function to verify droplet position is advantageous for improving the reliability of operation for the intended application; errors associated with droplet movement operations (e.g. when a droplet fails to move between adjacent array elements when it is intended that it should do so) are detected by the sensor function, which is able to determine that the position of the liquid droplet 4 is not as is intended. A suitable voltage pattern to correct the error and restore the position of the droplet to the intended location may then be calculated (e.g. by a computer program controlling operation) and implemented so as to correct the error.

According to utilization 2 above, the sensor function may be used to determine the size/volume of the liquid droplet. The measured impedance at a given array element will be a function of the proportion of that array element that is covered by liquid. By measuring the impedance at multiple array elements in the vicinity of the liquid droplet it is thus possible to measure the size of the liquid droplet by summing up the contributions of the measured impedance at each array element.

Figure 28:
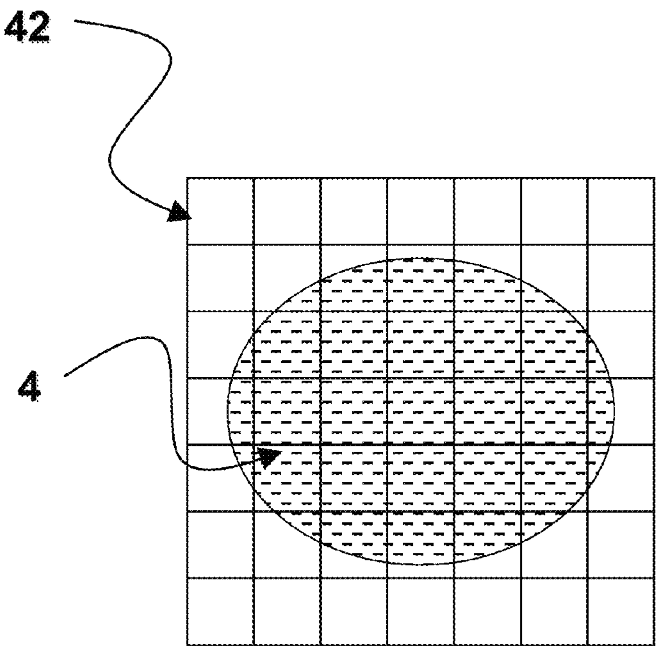
FIG. 28 shows an example part of the two dimensional array of electrodes 42
Figure 29:
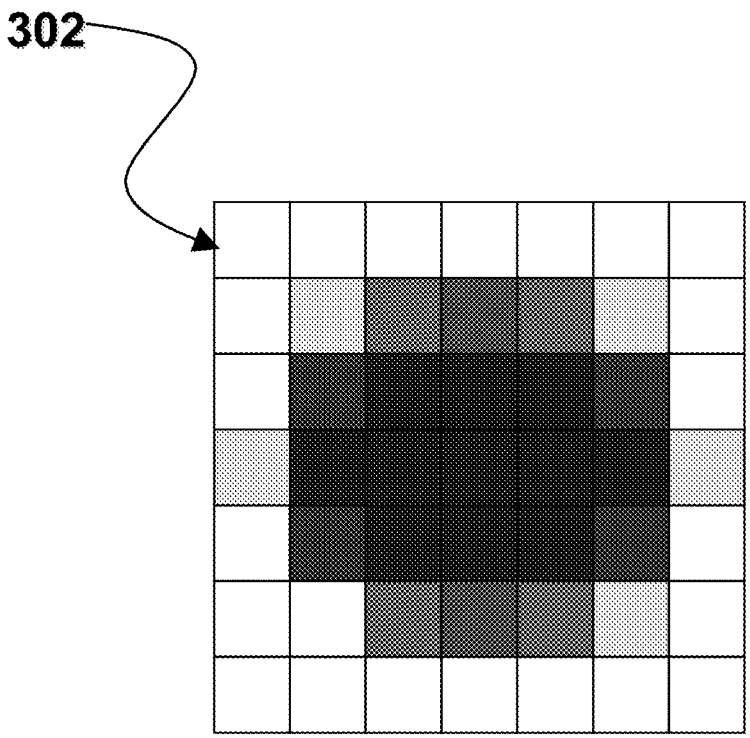
FIG. 29 shows a portion of the sensor output image

It may be noted that in certain modes of operation it may be advantageous for the typical diameter of the liquid droplet to be significantly larger than the array element size, for example such that droplet covers several array elements simultaneously. FIG. 28 shows an example part of the two dimensional array of electrodes 42 where a liquid droplet 4 covers multiple array elements simultaneously. FIG. 29 shows the corresponding portion of the sensor image, each pixel of the sensor output image 302 being colored according to the measured impedance, a darker color representing a larger measured impedance. It can be seen from this portion of the image in FIG. 29 how the proportion of droplet covering each array element may be determined from the sensor image, and it will be apparent that by summing the contributions from all array elements in the vicinity of the droplet, the total droplet size may be determined.

The ability to determine droplet size may be advantageous in a number of applications. For example if the AM-EWOD device is being used to perform a chemical reaction, the droplet sizing function can be used to meter the quantities of reagents involved.

The control timings associated with the voltage write function and impedance sensing functions may be flexible and implemented such that these two functions may be utilized in combination in any one of a number of ways, for example A. The device may be operated such that a frame of write data is written, followed by an image of sensor data being measured, followed by a further frame of write data being written, followed by a further image of sensor data being measured, etc.

B. The device may by operated such that multiple frames of write data are written, followed by a single image of sensor data being measured, followed by further multiple frames of write data being written, followed by a further image of sensor data being measured, etc.

C. The device may be operated such that write data is written at the same time as sensor data being measured. This can be achieved by performing the write operation on a given row N of the array whilst simultaneously performing the sense operation on a different row M of the array. The row driver 76 and column driver 78 circuits may be configured such that the time required to write a row and sense a row are the same, such that all the rows in the array may be successively written at one time and sensed at a different time such that the write and sense operations of any one particular row are never simultaneous.

The preferable mode of operation (A, B or C) as described above may depend on the particular droplet operation that is being performed. For example, for operations such as droplet mixing mode B may be preferable since the voltage write pattern can be updated rapidly and in this case it may not be necessary to monitor the sensor output for every written frame of data. In a second example, for the operation of droplet movement, mode C may be found to be advantageous since simultaneous operation of the sensor and write operations enables fast movement to be achieved (since the data pattern written can be rapidly refreshed) whilst also providing error detection capability by means of the sensor function.

It may also be noted that in certain circumstances it may also be advantageous to perform the reset operation whilst the AM-EWOD write voltage $V_{WRITE}$ is being written to the EW drive electrode 152 via the source addressing line 62.

This is the case, for example, when operating in mode C described above, where one wishes to perform a sense operation on array elements within one row of the array whilst simultaneously writing a voltage to the EW drive electrode 152 of array elements in a different row. This is because during the write operation, if a step in voltage occurs at the EW drive electrode 152, then a proportion of this voltage will couple via coupling capacitor $C_C$ 146 to the sense node 102. This may have the effect of turning on to some extent transistor 94 in the row to which a write voltage $V_{WRITE}$ is being written. This will in turn influence the potential of the sensor output line COL 106, and thus affect the sensor function of the row being sensed. This difficulty can be avoided by performing a reset operation on the row being written, thus pinning the potential of the sense node 102 for elements in this row and preventing transistor 94 from being turned on. The advantages of this embodiment are as follows:

- A voltage $V_{WRITE}$ programmed to the EW drive electrode 152 is not destroyed by performing the sense operation and is only disturbed for a short duration during the application of the sensor row select pulse on the sensor row select line RWS 104
- No additional DC leakage path to the EW drive electrode 152 is introduced by the addition of the sensor function-the only leakage path of charge written to the EW drive electrode 152 is through the transistor 68, as is the case for a standard AM-EWOD.
- In the case where high voltages are required to be written to the EW drive electrode 152, the only active device which is specifically required to be high voltage compatible is the switch transistor 68. In particular devices 94, 148 and 202 are not required to be high voltage compatible. This is especially important for transistor 94, which has an analogue function and may therefore be impaired in performance if device engineering to improve robustness (e.g. LDD, GOLD, increased length, etc) is required. A circuit arrangement whereby 94, 148 and 202 can be standard low voltage devices is also advantageous in that these devices have a smaller footprint in layout. This may facilitate a smaller physical dimension of array element size and/or create space for other circuitry to be included within the array element.
- Low voltage operation of circuit components may improve circuit yield and increase product robustness.

It may be noted that not all of these advantages would be realised in the case where the sense node 102 was DC coupled to the EW drive electrode 152 (for example by replacing coupling capacitor $C_C$ 146 with a short circuit). In this case an additional leakage path would be introduced to the EW drive electrode 152 (leakage through the reverse biased diode 148), the EW drive voltage $V_{WRITE}$ as written would be destroyed by performing the sense operation and high voltages would appear across the terminals of transistor 94 and diode 148.

In a typical design, the value of storage capacitor $C_S$ may be relatively large, for example several hundred femto-farads (fF). To minimise the layout area it is therefore advantageous to implement this device as a MOS capacitor.

Figure 30:
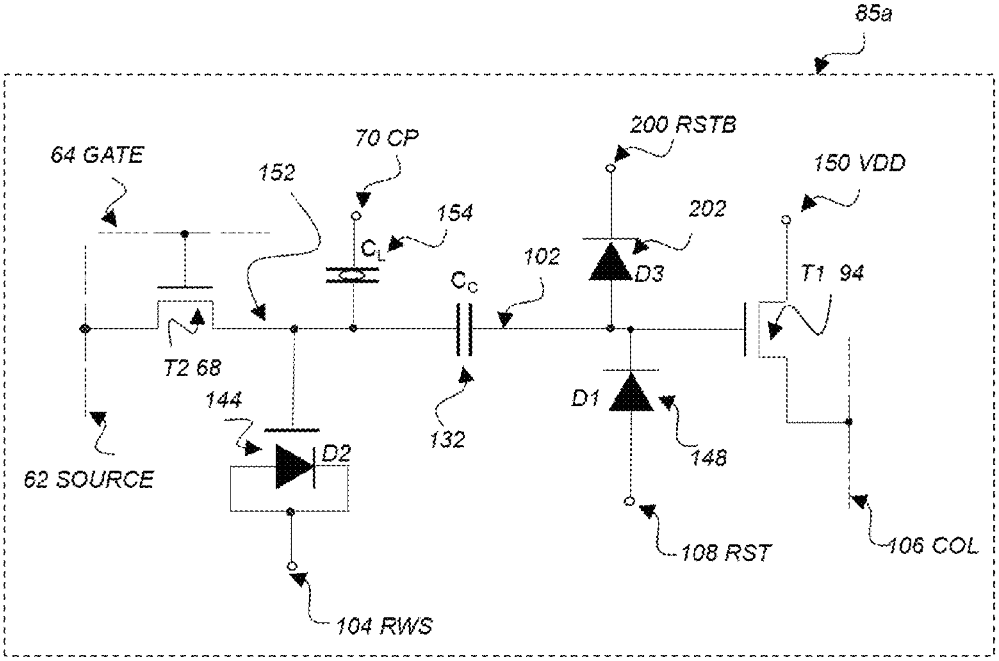
FIG. 30 shows the array element circuit of a second embodiment of the invention.

The array element circuit 85*a* of a second embodiment of the invention is shown in FIG. 30. This embodiment is identical to the first embodiment except that the capacitor $C_S$ 58 is replaced by a gated P-I-N diode 144 as described above with reference to FIG. 21. The gated diode is connected such that the anode and cathode are connected together and are connected to the sensor row select line RWS 104 and the gate terminal is connected to the EW drive electrode 152.

The operation of the second embodiment is identical to that of the first embodiment, where the gated P-I-N diode 144 performs the function of the capacitor $C_S$ of the first embodiment. In general the voltage levels of the pulse provided on the sensor row select line RWS 104 are arranged such that the capacitance of the gated P-I-N diode 144 is maintained at the maximum level for both the high and low levels of the RWS voltage.

The advantage of this embodiment is that by using a gated P-I-N diode 144 to perform the function of a capacitor, the voltage levels assigned to the RWS pulse are not required to be arranged so that the voltage across the device is always above a certain threshold level (in order to maintain the capacitance). This means that the voltage levels of the RWS pulse high and low levels can, for example, reside wholly within the programmed range of the EW drive voltages. The overall range of voltages required by the array element circuit 85*a* as a whole is thus reduced compared to that of the first embodiment where a MOS capacitor is used to implement capacitor $C_S$ 58.

This advantage is realised whilst also maintaining a small layout footprint of the gated diode, comparable to that of a MOS capacitor. The small layout footprint may be advantageous in terms of minimising the physical size of the circuit elements in the array, for the reasons previously described. It will be apparent to one skilled in the art that this embodiment could also be implemented with the gated P-I-N diode 144 connected the other way round, i.e. with the anode and cathode terminals both connected to the EW drive electrode 152, and the gate terminal connected to the sensor row select line RWS 104.

It will be readily apparent to one skilled in the art that a number of variants to the circuits of the first and second embodiments could also be implemented. For example, the source follower transistor 94 and switch transistor 68 could both be implemented with pTFT devices rather than nTFT devices.

None of these changes substantially affect the basic operation of the circuit as described above. Therefore, further detail is omitted for sake of brevity.

Figure 31:
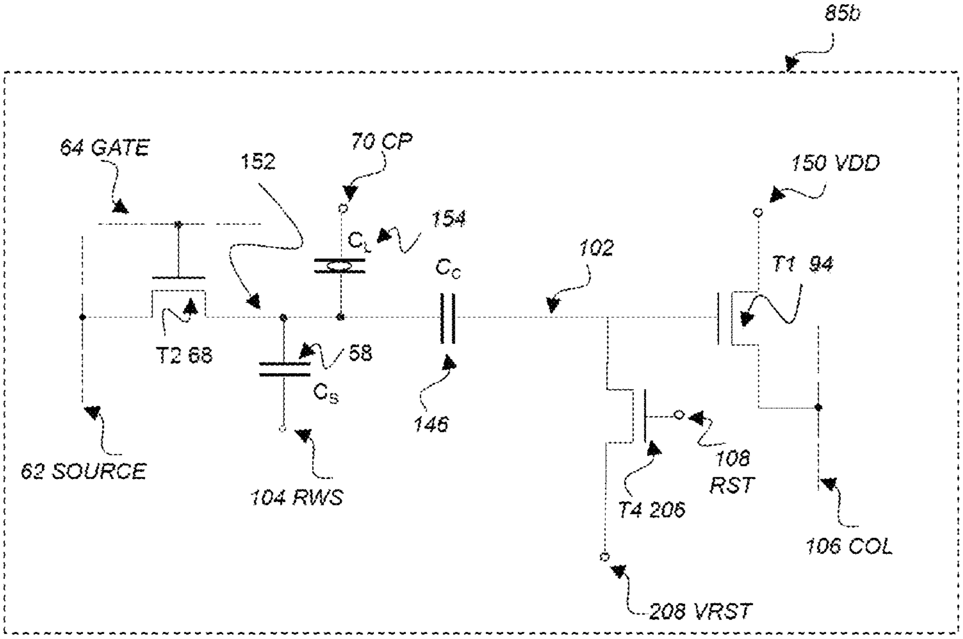
FIG. 31 shows the array element circuit of a third embodiment of the invention.

The array element circuit 85*b* of a third embodiment of the invention is shown in FIG. 31. This embodiment is as the first embodiment except that the diodes 148 and 202 have been removed, the reset line RSTB 200 has been removed, and the following additional array elements have been added An n-type transistor 206

A power supply line VRST 208 which may be common to all elements in the array.

The reset line RST 108 in this embodiment is connected to the gate of transistor 206. The source and drain terminals of transistor 206 are connected to the sense node 102 and the power supply line VRST 208 respectively.

The operation of this embodiment is as described for the first embodiment except in the performance of the reset operation. In this embodiment reset is performed by taking the reset line RST 108 to a logic high level. This has the effect of turning on transistor 206 such that the potential of the sense node 102 is charged/discharged to the reset potential on power supply line VRST 208. When the reset operation is not being performed, the reset line RST 108 is switched to logic low so as to switch transistor 206 off.

An advantage of this embodiment over the first embodiment is that it can be implemented without the need for any diode elements (diodes may not be available as standard library components within the manufacturing process). A further advantage of this embodiment is that the array element circuit 85*b* requires only n-type TFT components and is thus suitable for implementation within a single channel manufacturing process (where only n-type devices are available).

Figure 32:
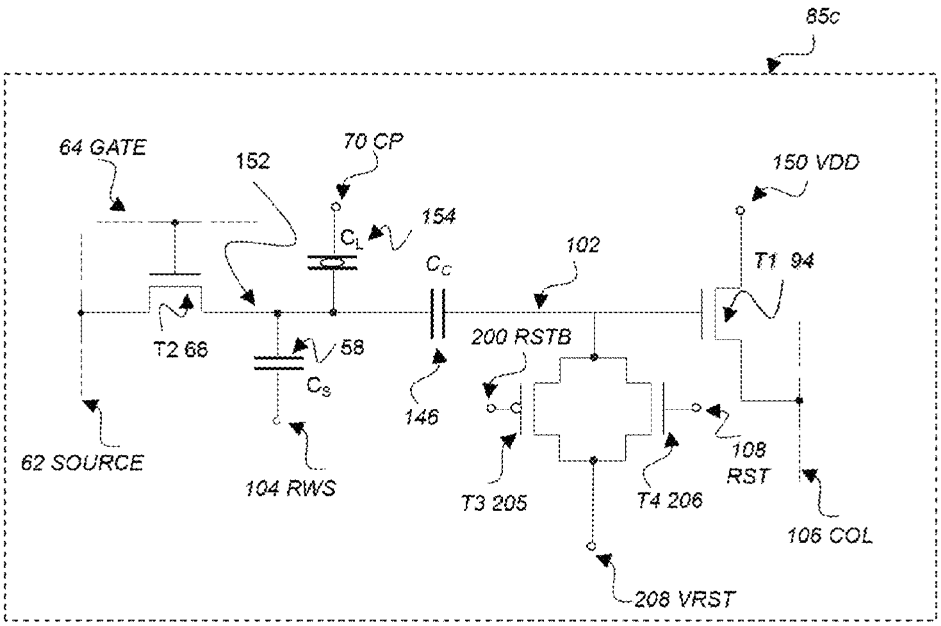
FIG. 32 shows the array element circuit of a fourth embodiment of the invention.

The array element circuit 85*c* of the fourth embodiment is shown in FIG. 32.

This embodiment is as the first embodiment of FIG. 27 except that the diodes 148 and 202 have been removed and the following additional array elements have been added A p-type transistor 205

An n-type transistor 206

A power supply line VRST 208 which may be common to all elements in the array.

The reset line RST 108 is connected to the gate of transistor 206. The reset line RSTB 200 is connected to the gate of transistor 205. The source of transistors 205 and 206 are connected together and to the sense node 102. The drain of transistors 205 and 206 are connected together and to the power supply line VRST 208.

The operation of this circuit is as described for the first embodiment in FIG. 27 except in the performance of the reset operation. In this embodiment reset is performed by taking the reset line RST 108 to a logic high level and the reset line RSTB 200 to a logic low level. This has the effect of turning on transistors 205 and 206 such that the potential of the sense node 102 is charged/discharged to the reset potential on the power supply line VRST 208. When the reset operation is not being performed the reset lines RST 108 and RSTB 200 are switched to logic low and logic high levels respectively so as to switch transistors 205 and 206 off.

The advantages of this embodiment are as follows:

When the reset operation is performed, the sense node 102 is more rapidly discharged to the reset potential on the power supply line VRST 208 than in the case where reset is performed by diodes or by a single switch transistor as in FIGS. 27, 30 and 31. This may reduce element-to-element variations in the voltage to which the sense node 102 is reset to.

The voltage levels of the logic signals applied to the reset lines RST 108 and RSTB 200 can be the same. This simplifies the design of the driver circuits in comparison to the first embodiment.

The array element circuit 85 is implemented without the need for diodes. This may be beneficial in processes where a thin film diode is not a standard circuit element.

Figure 33:
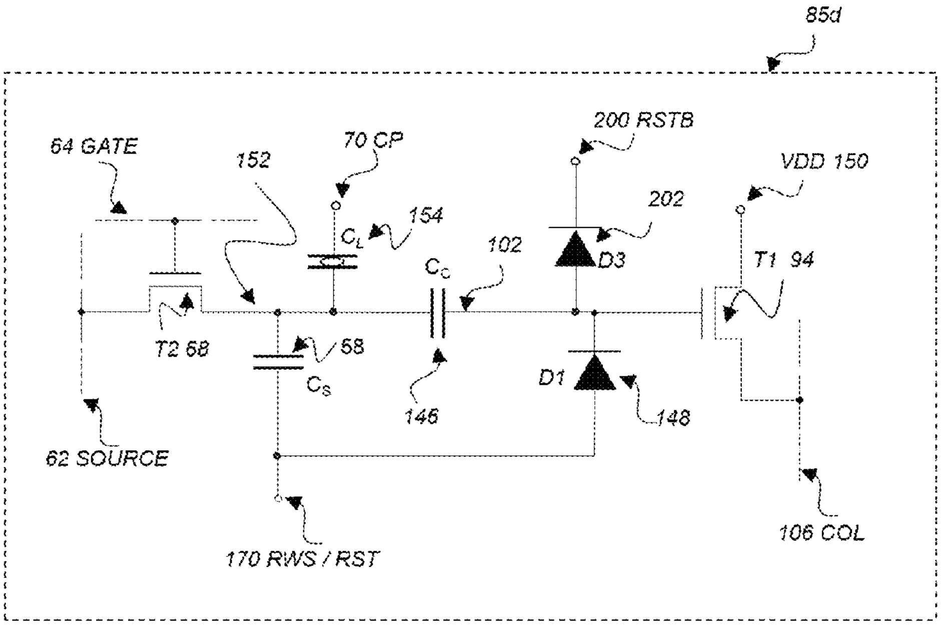
FIG. 33 shows the array element circuit of a fifth embodiment of the invention.

The array element circuit 85*d* of a fifth embodiment of the invention is shown in FIG. 33. This embodiment is as the first embodiment except that the row select line RWS and the reset line RST are connected together to form a dual purpose line RST/RWS 170.

The operation of the array element circuit 85*d* is similar to the first embodiment. Initially the sense node 102 is reset by switching the line RST/RWS 170 to a voltage level $V_1$ sufficient to forward bias diode 148 and the connection to the reset line RSTB 200 to a voltage sufficient to forward bias diode 202. The line RST/RWS 170 is then switched to a lower voltage level $V_2$ such that the diode 148 is reverse biased, and reset line RSTB 200 is taken to a high value such that diode 202 is reverse biased. During the row select operation, the line RST/RWS 170 is then switched to a third voltage level $V_3$, creating a voltage step of magnitude $V_3-V_2$, which in turn perturbs the voltage at the EW drive electrode 152 and sense node102, thus enabling the impedance CL to be measured. A requirement for the circuit to operate properly is that voltage levels $V_2$ and $V_3$ must be less than $V_1$ and so not forward bias diode 148 during the row select operation.

An advantage of this embodiment is that the number of voltage lines required by the array element is reduced by one compared with the first and second embodiments, whilst also maintaining the capability to perform a reset operation.

Figure 34:
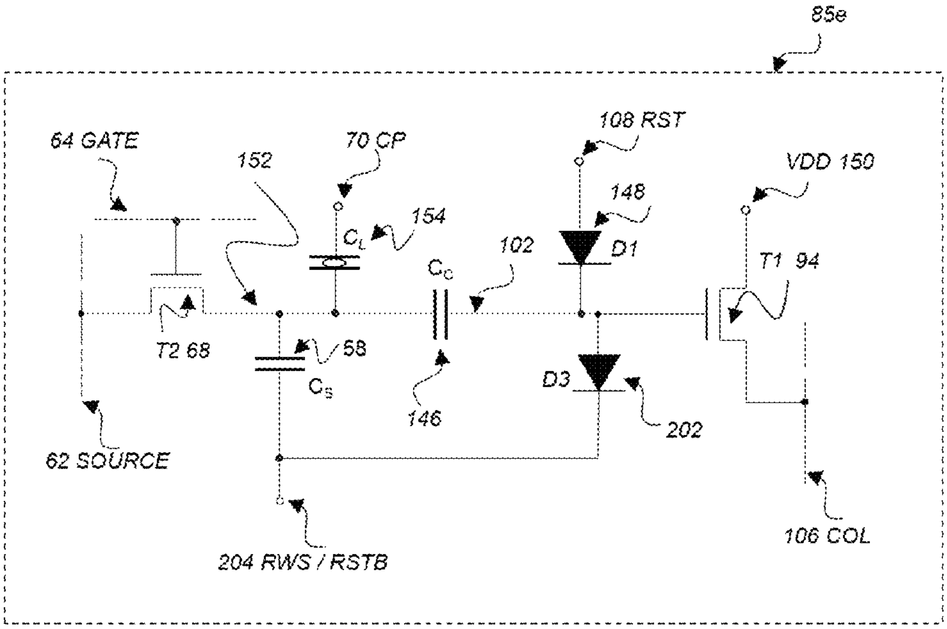
FIG. 34 shows the array element circuit of a sixth embodiment of the invention

The array element circuit 85e of a sixth embodiment is shown in FIG. 34. This embodiment is as the fifth embodiment except that in this case the RSTB and RWS lines are connected together to form a common connection, the RWS/RSTB line 204. The operation is similar to the first embodiment. To perform the reset operation, the reset line RST 108 is set to a reset voltage VRST sufficient to forward bias diode 148, and the same reset voltage VRST is also applied to the RWS/RSTB line 204. The sense node 102 is thus reset to the reset voltage VRST. To perform the row select operation, diode 148 is reversed biased with an appropriate potential applied to the reset line RST 108 and a voltage level $V_5$ is applied to the RWS/RSTB line 204 in excess of VRST. The diode 202 is reverse biased and turned off, whilst simultaneously the potential of the sense node 102 is perturbed by an amount dependent on the voltage difference $V_5$-VRST and the various circuit capacitances as described in the first embodiment.

An advantage of the sixth embodiment in comparison to the first embodiment is that the number of voltage lines required by the array element is reduced by one. An advantage of the sixth embodiment compared to the fifth embodiment is that only two different voltage levels need to be applied to the line RWS/RSTB line 204 during operation. This has the advantage of simplifying the control circuits required to drive the connection.

It will be apparent to one skilled in the art that the fifth and sixth embodiments could also be implemented where the source follower transistor if a p-type transistor and the row select operation is implemented by a negative going pulse applied to the RWS/RST, RWS/RSTB lines.

Figure 35:
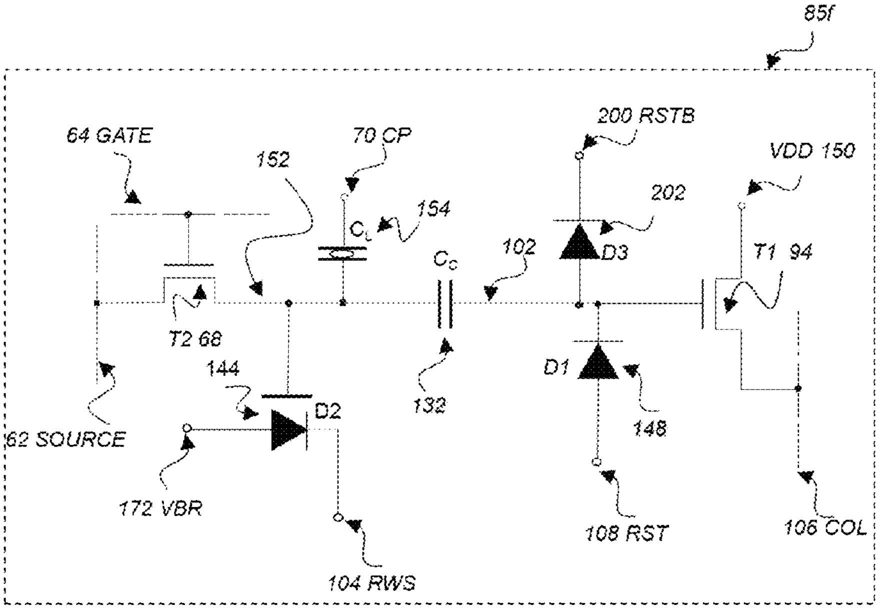
FIG. 35 shows the array element circuit of a seventh embodiment of the invention

The array element circuit 85*f* of the seventh embodiment of the invention is shown in FIG. 35. This embodiment is as the second embodiment except that instead of connecting the anode terminal of the gated P-I-N diode144 to the sensor row select line RWS 104, it is instead connected to a bias supply VBR 172. This connection may be driven separately for each array element in the same row. The bias supply VBR is set to a voltage that is always negative with respect to the sensor row select line RWS 104 voltage so that the gated P-I-N diode 144 is always reverse biased.

The operation of the circuit is essentially similar to that of the second embodiment with the exception that the bias supply VBR 172 is maintained at a bias VX below that of the bias voltage of the sensor row select line RWS 104 throughout the operation of the circuit. This has the effect of making the gated P-I-N diode 144 function like a voltage dependent capacitor, having a bias dependence that is a function of VX, as described in prior art.

By choosing the range of operation of the RWS pulse high and low levels and an appropriate value of VX it is therefore possible to make the gated P-I-N diode 144 function as a variable capacitor whose value depends upon the choice of VX. The overall circuit functions as described in the second embodiment, where the gated P-I-N diode 144 is a capacitor whose capacitance can be varied. The circuit can therefore effectively operate in different ranges according to whether this capacitance is arranged to take a high or a low value An advantage of the circuit of this embodiment is that a higher range of droplet impedances can be sensed than may be the case if the capacitance is implemented as a fixed value. A further advantage is that a variable capacitor may be implemented by means of no additional circuit components and only one additional bias line.

Whilst this embodiment describes a particularly advantageous implementation of a variable capacitance, it will be apparent to one skilled in the art that there are multiple other methods for implementing variable or voltage dependent capacitors. For example, additional TFTs which function as switches could be provided. These could be configured to switch in or out of the circuit additional capacitor elements. These could be arranged either in series or in parallel with capacitor $C_S$.

Figure 36:
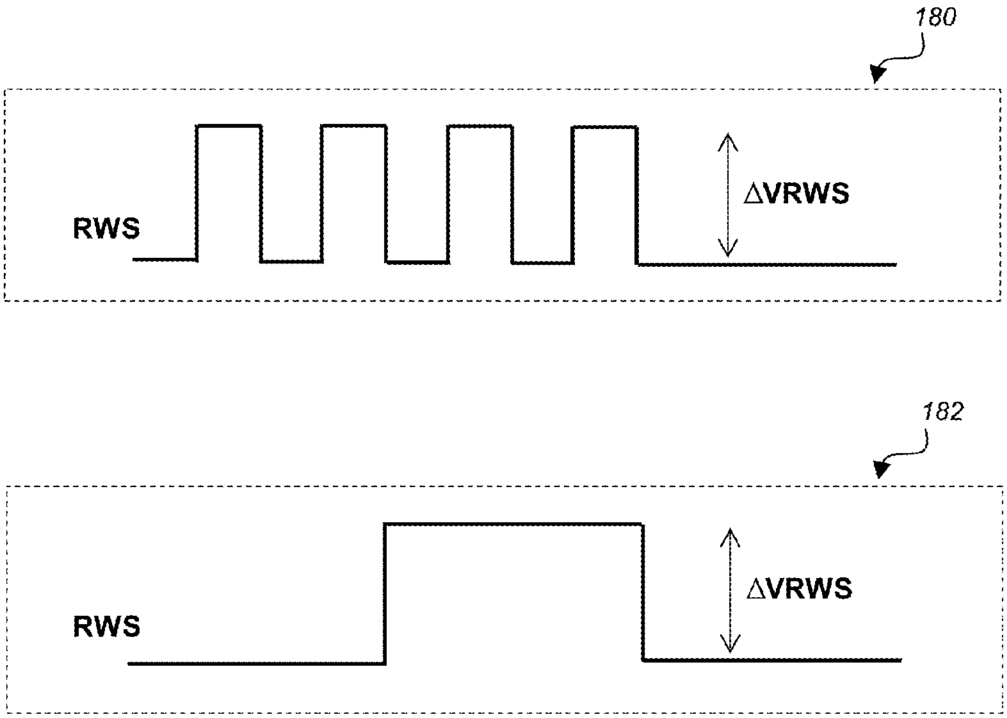
FIG. 36 shows a timing sequences applied to the row select connection of the pixel circuit according to the operation of the eighth embodiment of the invention.

The eighth embodiment of the invention is as any of the previous embodiments where the voltage pulse applied to the sensor row select line RWS 104 is arranged to consist of N multiple pulses. This is shown in FIG. 36, with the row select pulse 180 as applied to the sensor row select line RWS 104 in the case where N=4, where N represents the number of pulses. Also shown for comparison in the same Figure is the row select pulse 182 as applied to the sensor row select line RWS 104 of the previous embodiments.

The operation of the circuit is then otherwise identical to as was described in the first embodiment. However the response of the array element circuit 85 to the modified RWS pulse 180 may differ in accordance with the constituent components of the droplet impedance. This can be appreciated with reference to FIG. 8. When a voltage pulse is applied across the compound droplet impedance, the response of the intermediate node 47 is time dependent; this node takes a certain time to charge/discharge in accordance with the component values $R_{drop}$ and $C_{drop}$. These component values depend on the droplet constitution. The response of the circuit may therefore be a function of the number and duration of RWS pulses applied to the sensor row select line RWS 104.

According to this embodiment, a series of multiple impedance measurements may be made, these being performed where the number of component pulses comprising the row select pulse, N, is different for each individual measurement. By determining the sensor output for two or more different values of N it is thus possible to measure the frequency dependence of the droplet capacitance $C_L$. Since the insulator capacitance $C_i$ is generally known, this method can further be used to determine information regarding the impedance components $C_{drop}$ and $R_{drop}$. Since these are related to the droplet constitution, for example its conductivity, information regarding the droplet constitution may be determined.

In this mode of operation it is useful, although not essential, to arrange the RWS pulse on the sensor row select line RWS 104 such that the total time for which this connection is at the high level is the same for each N. This ensures that the source follower transistor 94 is turned on (to an extent determined by the various impedances) for the same amount of time, regardless of the value of N.

Figure 37:
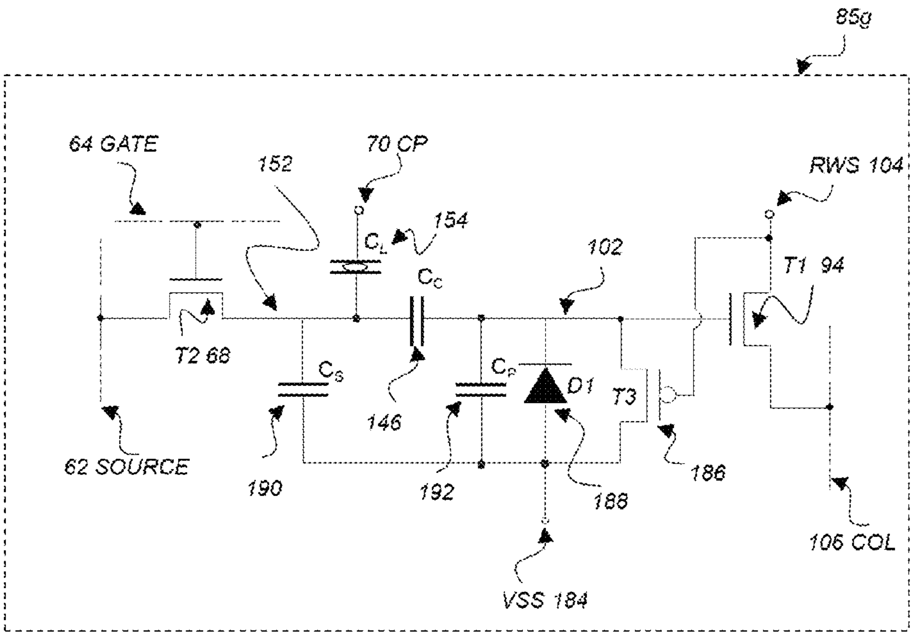
FIG. 37 shows the array element circuit of a ninth embodiment of the invention.

The array element circuit 85*g* of the ninth embodiment of the invention is shown in FIG. 37. This consists of an alternative array element circuit for an AM-EWOD device with integrated impedance sensor.

The circuit contains the following elements:

A switch transistor 68

A capacitor $C_S$ 190

A capacitor $C_P$ 192

A coupling capacitor $C_C$ 146

A diode 188

A transistor 94

A transistor 186

Connections supplied to the array element circuit 85*g* are as follows:

- A source addressing line 62 which is shared between array element circuits 85*g* in the same column
- A gate addressing line 64 which is shared between array element circuits 85*g* in the same row
- A sensor row select line RWS 104 which is shared between array element circuits 85*g* in the same row
- A power supply line VSS 184 which is common to all array element circuits 85*g* in the array
- A sensor output line COL 106 which is shared between array element circuits 85*g* in the same column Each array element contains an EW drive electrode 152 to which a voltage $V_{WRITE}$ can be programmed. Also shown represented is a load element $C_L$ 154 representing the impedance between the EW drive electrode 152 and the counter-substrate 36. The value of $C_L$ is dependent on the presence of, size of and constitution of any droplet at the array element in the array as in the previous embodiments.

The circuit is connected as follows:

The source addressing line 62 is connected to the drain of transistor 68. The gate addressing line 64 is connected to the gate of transistor 68. The source of transistor 68 is connected to the EW drive electrode 152. Capacitor $C_S$ 190 is connected between the EW drive electrode 152 and the power supply line VSS 184. Coupling capacitor $C_C$ 146 is connected between the EW drive electrode 152 and the gate of transistor 94. The anode of the diode 188 is connected to the power supply VSS 184. The cathode of the diode 188 is connected to the gate of transistor 94. The drain of the switch transistor T3 186 is connected to the gate of transistor 94. The source of transistor T3 is connected the power supply VSS 184. The gate of transistor T3 186 is connected to the sensor row select line RWS 104. The drain of transistor 94 is connected to the sensor row select line RWS 104. The source of transistor 94 is connected to the sensor output line COL 106. The capacitor $C_P$ is connected between the sense node 102 and the power supply VSS 184.

The operation of the array element circuit 85*g* is as follows:

In order to write a voltage, the required write voltage $V_{WRITE}$ is programmed onto the source addressing line 62. The gate addressing line 64 is then taken to a high voltage such that transistor 68 is switched on. The voltage $V_{WRITE}$ (plus or minus a small amount due to non-ideality of 68) is then written to the EW drive electrode 152 and stored on the capacitance present at this node, and in particular on capacitor $C_S$. The gate addressing line 64 is then taken to a low level to turn off transistor 68 and complete the write operation.

In order to sense the impedance presented at the EW drive electrode 152, a voltage pulse is applied to the electrode of the counter-substrate 36. A component of this voltage pulse is then AC coupled onto the EW drive electrode 152 and on to the sense node 102. For the row of the array element to be sensed, the sensor row select line RWS 104 is taken to a high voltage level. This results in switch transistor T3 186 being switched off so that there is no DC path to ground from the sense node 102. As a result the voltage coupled onto the sense node 102 results in the source follower transistor 94 being partially turned on to an extent which is in part dependent on the capacitive load of the droplet $C_L$. The function of capacitor $C_P$ is to ensure that voltage coupled onto the sense node 102 from the pulse applied to the counter substrate is not immediately discharged by parasitic leakage through transistor 186 and diode 148. $C_P$ should therefore be sufficiently large to ensure that the potential at the sense node 102 is not unduly influenced by leakage through the transistor 186 and the diode 148 for the duration of the sense operation.

For row elements not being sensed, transistor 186 remains switched on so that the component of the voltage pulse from the counter-substrate 36 coupled onto the sense node 102 is immediately discharged to VSS.

To ensure successful operation, the low level of the RWS pulse and the bias supply VSS must be arranged such that the source follower transistor 94 remains switched off when the RWS pulse on the sensor row select line RWS 104 is at the low level.

An advantage of this embodiment compared to the first embodiment is that one fewer voltage supply line per array element is required.

Figure 38:
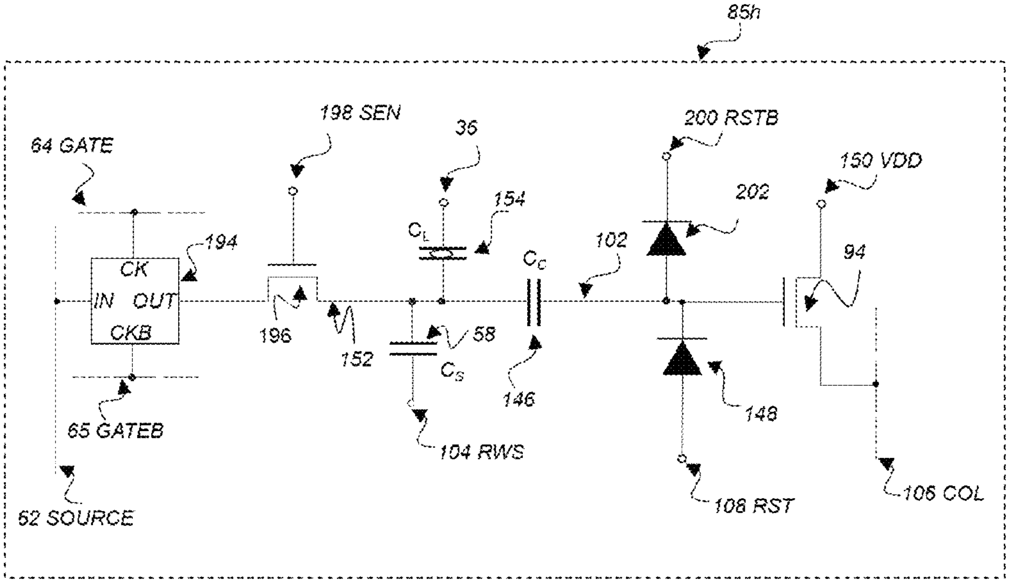
FIG. 38 shows the array element circuit of a tenth embodiment of the invention.

The array element circuit 85h of the tenth embodiment of the invention is shown in FIG. 38.

The circuit contains the following elements:

A transistor 196

A capacitor $C_S$ 58

A coupling capacitor $C_C$ 146

A diode 148

A diode 202

A transistor 94

An SRAM cell 194 as described in the prior art containing IN, OUT, CK and CKB terminals Connections supplied to the array element circuit are as follows:

A source addressing line 62 which is shared between array element circuits 85*h* in the same column A gate addressing line 64 which is shared between array element circuits 85 in the same row A gateb complement addressing line 65 which is shared between array element circuits 85 in the same row and which carries the logical complement of the signal on the gate addressing line 64

A sensor enable line SEN 198 which may be shared between array element circuits 85*h* in the same row or which in an alternative implementation may be common to all elements in the array A sensor row select line RWS 104 which is shared between array element circuits 85*h* in the same row A reset line RST 108 which is shared between array element circuits 85*h* in the same row A second reset line RSTB 200 which is shared between array element circuits 85*h* in the same row A power supply line VDD 150 which is common to all array element circuits 85*h* in the array A sensor output line COL 106 which is shared between array element circuits 85*h* in the same column Each array element circuit 85h contains an EW drive electrode 152 to which a voltage $V_{WRITE}$ can be programmed. Also shown represented is a load element $C_L$ 154 representing the impedance between the EW drive electrode and the counter-substrate 36. The value of $C_L$ is dependent on the presence of, size of and constitution of any droplet at the located at that array element within the array.

The array element circuit 85*h* is connected as follows:

The source addressing line 62 is connected to the IN input of the SRAM cell 194. The gate addressing line 64 is connected to the CK terminal of the SRAM cell 194. The gateb addressing line 65 is connected to the CKB terminal of the SRAM cell 194. The OUT output of the SRAM cell is connected to the drain of transistor 196. The source of transistor 196 is connected to the EW drive electrode 152. The sensor enable line SEN 198 is connected to the gate of transistor 196. Capacitor $C_S$ 58 is connected between the source of 196 and the sensor row select line RWS 104. Coupling capacitor $C_C$ 146 is connected between the source of 196 and the gate of transistor 94. The anode of the diode 148 is connected to the reset line RST 108. The cathode of the diode 148 is connected to the gate of transistor 94 and to the anode of diode 202. The cathode of diode 202 is connected to the reset line RSTB 200. The drain of transistor 94 is connected to the VDD power supply line 150. The source of transistor 94 is connected to the sensor output line COL 106.

The operation of the circuit is similar to the first embodiment, except that a digital value is written to the EW drive electrode 152. To write a voltage to the EW drive electrode 152, the sensor enable line SEN 198 is taken high to switch on transistor 196. The required digital voltage level (high or low) is programmed on to the source addressing line 62. The gate addressing line 64 is then set high and the gateb addressing line 65 is set low to enable the SRAM cell 194 of the row being programmed and write the desired logic level onto the SRAM cell 194. The gate addressing line 64 is then taken low and the gateb line is taken high to complete the writing operation.

To perform a sensor operation the sensor enable line SEN 198 is taken low. The rest of the sensor portion of the circuit then operates in the same way as was described for the first embodiment of the invention. Following completion of the sensor operation the sensor enable line SEN 198 can be taken high again so that the programmed voltage stored on the SRAM cell 194 can be once again written to the EW drive electrode 152.

An advantage of this embodiment is that by implementing the write function of the AM-EWOD device using an SRAM cell 194, the write voltage is not required to be continually refreshed. For this reason an SRAM implementation can have lower overall power consumption than implementation using a standard display pixel circuit as described in previous embodiments.

The above-described embodiment includes an SRAM cell 194 which receives global gate addressing line 64 and gateb complement addressing line 65 signals. However, it will be apparent to one skilled in the art that the gateb complement addressing line 65 may be omitted and the signal on the gate addressing line 64 may be inverted within each array element using standard means.

Figure 39:
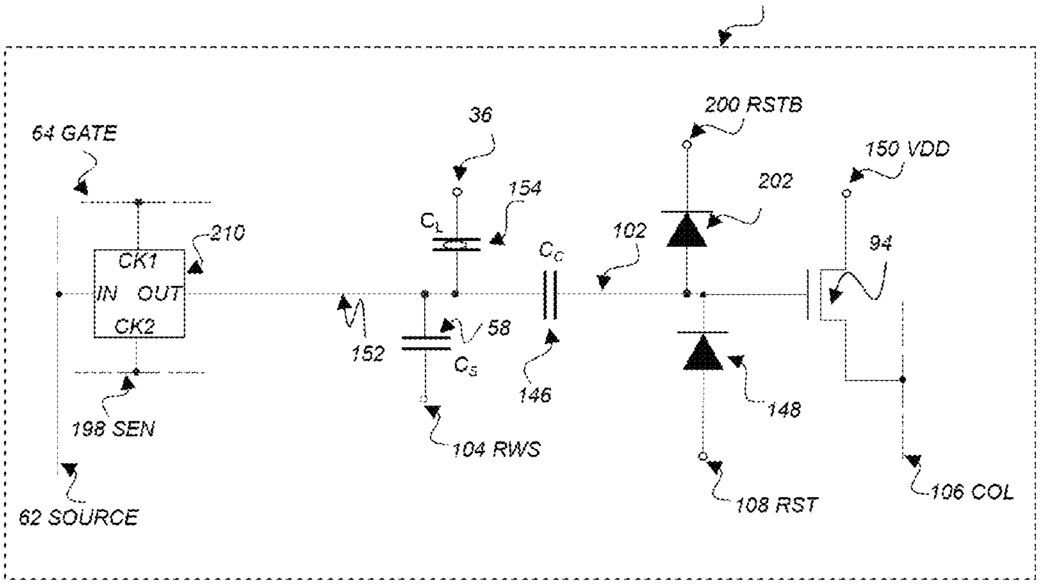
FIG. 39 shows the array element circuit of an eleventh embodiment of the invention.

The array element circuit 85*i* of the eleventh embodiment of the invention is shown in FIG. 39.

The circuit is the same as that described in the tenth embodiment shown in FIG. 38, with the following exceptions:

- The SRAM cell 194 is replaced by a modified SRAM cell 210 containing IN, OUT, CK1 and CK2 terminals
- Transistor 196 is removed; the OUT output of the modified SRAM cell 210 is connected to the EW drive electrode 152
- The gateb addressing line 65 is removed; the sensor enable line SEN 198 is connected to the CK2 input of the modified SRAM cell 294

Figure 40:
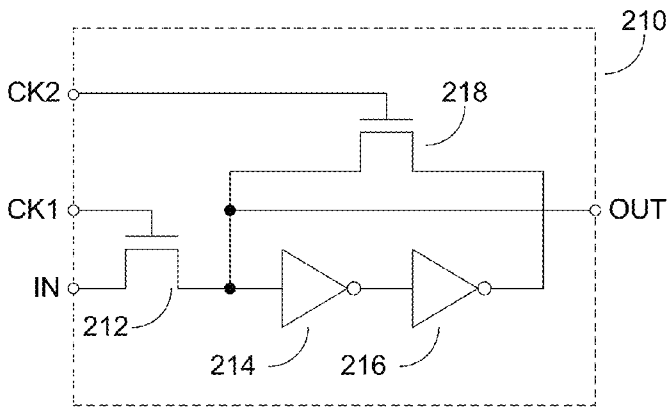
FIG. 40 shows the modified SRAM cell of the eleventh embodiment of the invention.

The modified SRAM cell 210 is shown in FIG. 40, and contains the following elements:

- Transistors 212 and 218 (sampling switch and feedback switch, respectively)
- Logical inverters 214 and 216 (first and second inverters, respectively)
- Clock inputs CK1 and CK2 (first and second clock inputs, respectively)
- Data input IN
- Data output OUT The elements of the modified SRAM cell 210 are connected as follows:

The data input IN is connected to the source of transistor 212; the drain of transistor 212 is connected to the input of the first logical inverter 214, the drain of transistor 218, and the data output pin OUT (independent of, or bypassing the transistor 218); the output of the first logical inverter 214 is connected to the input of the second logical inverter 216; the output of the second logical inverter 216 is connected to the source of transistor 218; the gate of transistor 212 is connected to the first clock input CK1; the gate of transistor 218 is connected to the second clock input CK2. The clock inputs CK1 and CK2 are arranged to receive signals which are not logical complements. In this manner, the transistors 212 and 218 are switched at different times with respect to each other.

The operation of the circuit is similar to the tenth embodiment, except that the timing of the sensor enable line SEN 198 is modified: during writing of a voltage to the EW drive electrode 152, the gate addressing line 64 and the sensor enable line SEN 198 are set high and a digital voltage level (high or low) is programmed on to the source addressing line 62, as in the tenth embodiment; this voltage is passed directly to the EW drive electrode 152. The gate addressing line 64 is then taken low and the sensor enable line SEN 198 is taken high to complete the writing operation. This closes the loop in the modified SRAM cell 210, such that voltage on the OUT output of the cell is inverted by the first logical inverter 214, the output of the first logical inverter 214 is inverted by the second logical inverter 216, and this value, which is logically the same as the digital voltage level programmed on to the source addressing line 62 during writing, is driven to the OUT output. The modified SRAM cell 210 therefore operates in a similar fashion to the standard SRAM cell 194 and holds the data at its output.

As in the above embodiments, the various control signals on the control lines (e.g., the sensor enable line SEN 198, gate addressing line 64, etc.) are provided by timing circuitry which may be included within the row driver 76, column driver 78 and/or serial interface 80, for example.

As in the tenth embodiment, a sensor operation is performed by taking the sensor enable line SEN 198 low. This switches off transistor 218 in the modified SRAM cell 210 so that the OUT output, and therefore the EW drive electrode 152, floats (that is, they are not forced to a voltage by the second inverter 216). The rest of the sensor portion of the circuit then operates in the same way as was described for the first embodiment of the invention. During the sensor operation, the voltage on the EW drive electrode rises when the RWS signal 104 is taken high, but is returned to its original value when the RWS signal 104 is subsequently taken low at the end of the sensor operation. Following completion of the sensor operation the sensor enable line SEN 198 can be taken high again so that the loop within the modified SRAM cell 210 is closed and the data is held, and the programmed voltage stored on the modified SRAM cell 210 can be once again written to the EW drive electrode 152.

An advantage of this embodiment is that by using clock signals for the modified SRAM cell 210 that are not logical complements, one transistor and one signal line can be removed from the standard SRAM implementation described in the tenth embodiment. Reducing the number of devices and signals is desirable since it increases the yield of the circuit, reduces the area of the array element, permitting either smaller array elements or a larger aperture in each element, simplifies and reduces the area of the driver circuits, and reduces the power consumption of the array. The advantages of using an SRAM cell also apply as described in the tenth embodiment.

It will be obvious to one skilled in the art that either of the SRAM implementations of the write portion of the circuit described in the tenth and eleventh embodiments may also be combined with any one of embodiments 2-9.

Figure 41:
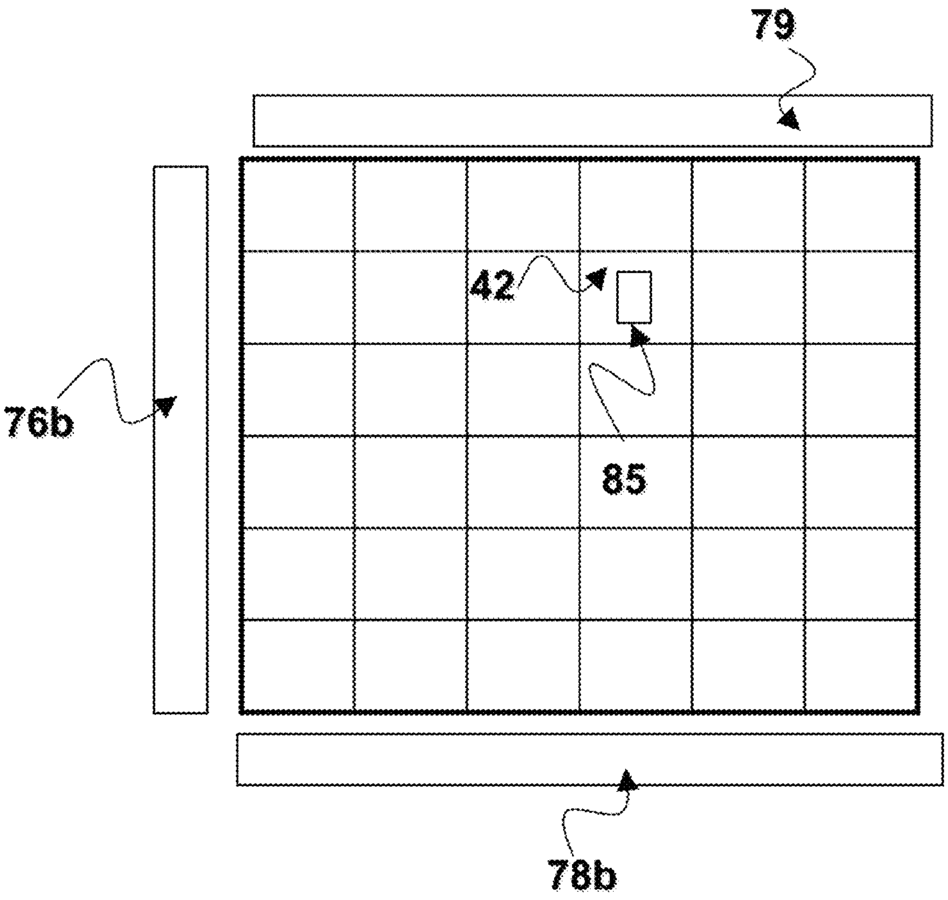
FIG. 41 shows a twelfth embodiment of the invention
Figure 42:
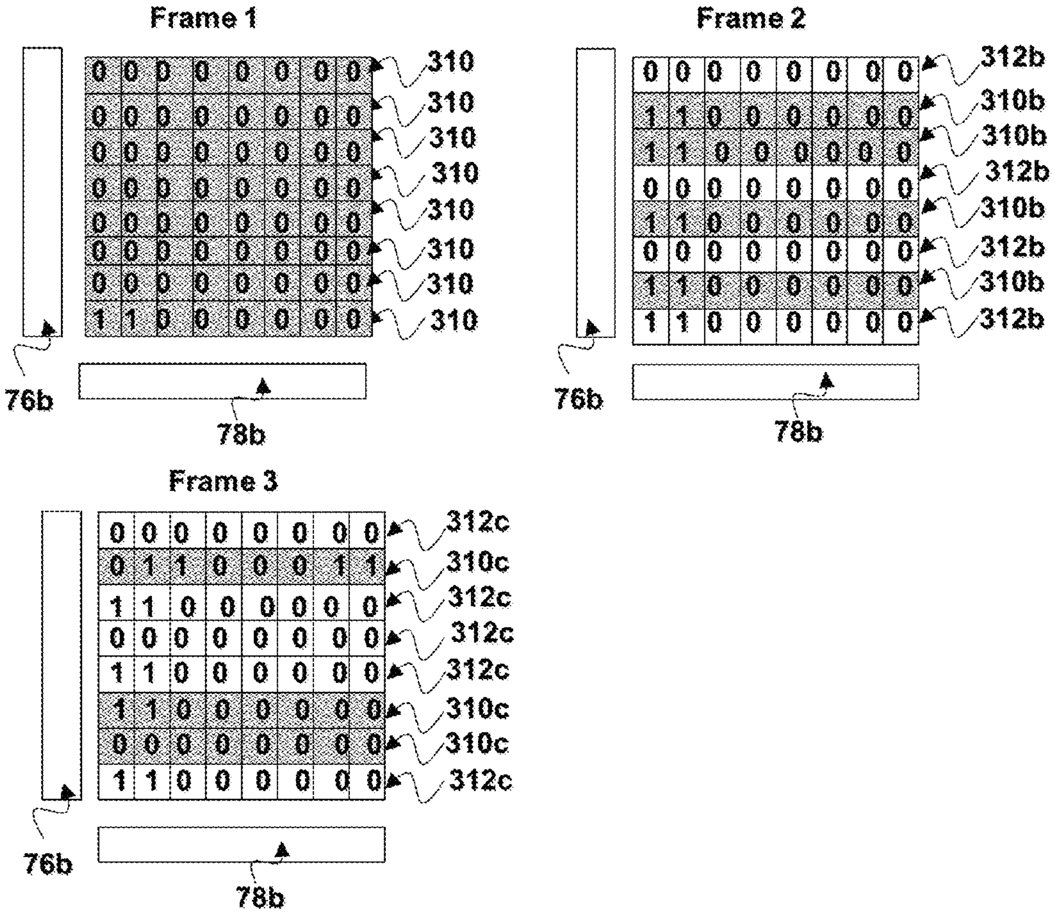
FIG. 42 shows an example implementation of the twelfth embodiment of the invention.

The twelfth embodiment of the invention is shown in FIG. 41 and consists of any of the previous embodiments where the voltage write function is implemented with a selective addressing scheme. Specifically, modified row driver 76*b* and column driver 78*b* circuits may be configured in such a way that write data can be written to any given subset of rows within the array without the need to re-write the whole array. FIG. 42 shows an example implementation of this embodiment. The figure shows the writing of three successive frames of data to the array. In the initial frame, frame 1, data is written to all the rows 310 of the array. An example pattern is shown with the written data denoted as “1” or as “0” in the position of each array element. In the following frame, denoted frame 2, a modified data pattern of "1"s and "0"s is written. In order to write this pattern only the data in rows 310*b* where the pattern of "1"s and "0"s differs from frame 1 need to be re-written. Rows 312*b* have the same pattern as previously and do not require re-writing. Similarly, frame 3 may then be written, where once again only a subset of rows 310*c* need to be re-written, since the data in the other rows 310*c* is unchanged. The subset of rows written in frame 3 may, as in this cae, differ from the subset of rows written in frame 2. It will be apparent to one skilled in the art based on the description herein how the example method and patterns shown in FIG. 42 may be generalised so that any arbitrary sequence of frames containing arbitrary patterns of "1"s and "0"s may be written to the array.

This method for writing data is frequently an advantageous means of addressing the array since in order to perform many droplet operations, it is only necessary to change the write voltages written to a small proportion of the total number of rows in the array. Thus, a proper subset of the array elements may be selectively addressed and written to, to the exclusion of the array elements not included in the proper subset. It may be noted that the subset of the array being written may be variable between successive frames of write data, and also that the subset of rows being written are not necessarily required to be contiguous rows of the array.

The advantages of this embodiment are that by operating with selective addressing, the time required to write new data to the array is reduced. As a result the time required to perform typical droplet operations (e.g. moving, splitting, and merging) can be performed is also reduced. This may be particularly advantageous for droplet operations which are required to be carried out in a short time, e.g. certain rate sensitive chemical reactions. A further advantage of this embodiment is that by reducing the requirement to re-write unchanged rows of write data, the power consumed in the row driver 306 and column driver 308 circuits may also be reduced.

It will be apparent that such a selective addressing scheme is particularly well suited to the array element circuit 85 having an SRAM cell 194 implementation of the memory function as described in the tenth embodiment. This is because the SRAM cell does not require periodic refreshing of the written data.

Figure 43:
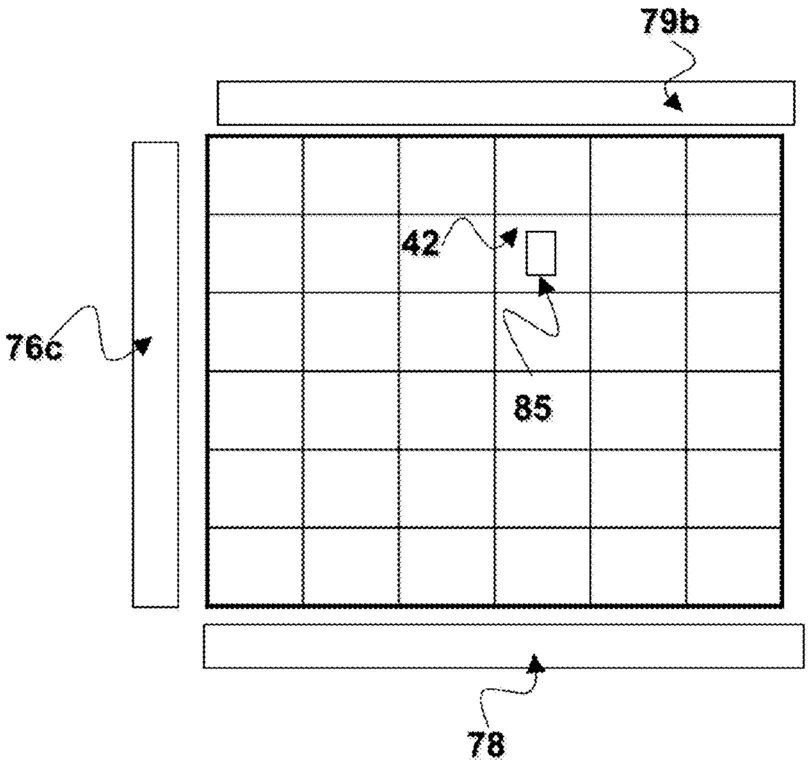
FIG. 43 shows a thirteenth embodiment of the invention.

The thirteenth embodiment of the invention is shown in FIG. 43. This embodiment is as any of the previous embodiments whereby the control circuits for the sensor function are used to selectively address and readout the sensor function of the array element circuit 85 in such a way that only a subset of the total number of sensor array elements is measured in a given frame of sensor readout data. Referring to FIG. 43, this may be achieved by means of a modified row driver circuit 76*c* to selectively control and apply drive pulses RST, RSTB and RWS to the array element circuit 85, and by means of a modified column output circuit 79*b* that samples and measure the output voltage at the sensor output COL of the impedance sensor array element circuit 85 and that may be selectively controlled such that for a given frame of sensor output data only a subset of the total number of array elements in is measured.

Figure 44:
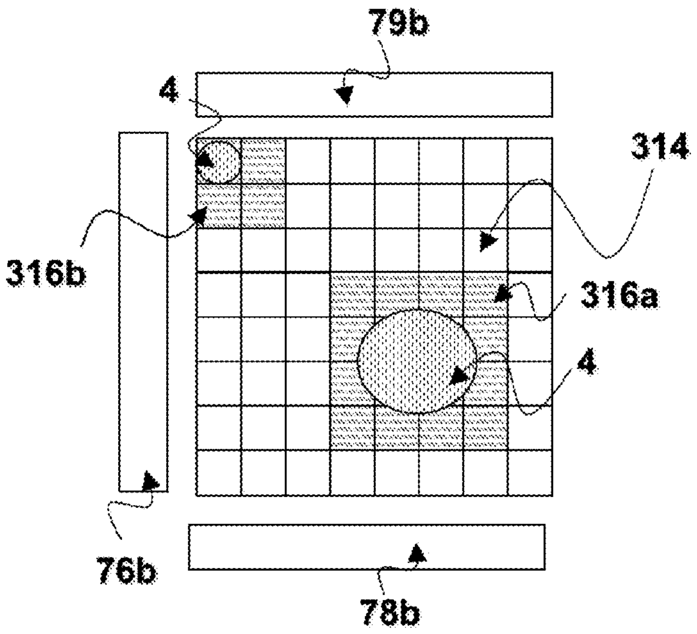
FIG. 44 shows an example implementation of the thirteenth embodiment of the invention.

According to this mode of operation the sensor function may typically be driven in such a way that only those regions of the array in the vicinity of where liquid droplets 4 are known to be present are sensed. Sensing just these regions is generally sufficient to meet the requirements of the sensor function, e.g. to determine the position of the liquid droplet 4 and/or their size. An example application of this embodiment is shown in FIG. 44. In this example two liquid droplets 4*b* and 4*c* are present in different locations of the array. The row driver circuit 76*c* and column output circuit 79*b* are configured such that only array elements in the regions in the proximity of the droplets, denoted 316*a* and 316*b* respectively and drawn with hatch markings are sensed. Array elements in the region of the array outside of this 314 (shown without hatch marking) are not sensed. Thus, a proper subset of the array elements may be selectively addressed and the impedance thereat sensed, to the exclusion of the array elements not included in the proper subset.

It may be noted that the spatial position of that sub-set of the array to be sensed may be varied between different frames of sensor data, and also that the sub-set of the array being sensed is not necessarily required to be a single contiguous portion of the array.

An advantage of this embodiment is that by operating the sensor function in such a way so as to sense the impedance in only a sub-set of the array, the time required to perform the sense operation is reduced. This may in turn facilitate faster droplet operations, as described for the twelfth embodiment. A further advantage of this embodiment is that by sensing only a sub-set of the whole array, the total power consumed by the sensor operation may also be reduced.

The fourteenth embodiment of the invention is as the first embodiment whereby an additional means of calibrating the impedance sensor function is also incorporated into the method of driving the array element circuit 85.

The motivation for including a sensor calibration function is that nominally identical circuit components in practice inevitably have some difference in performance due to processing variations (for example due to spatial variability of semiconductor doping concentration, the positions of grain boundaries within semiconductor material etc). As a result, the sensor output from nominally identical array element circuits 85 may in practice differ somewhat due to such manufacturing non-idealities. The overall result is that the impedance sensor function will exhibit some measure of fixed pattern noise (FPN) in its output image. Of particular importance in this regard is variability in the characteristics of the source follower input transistor, transistor 94, which leads to element-element fixed pattern noise in the sensor output image. Also important is variability in the characteristics of the column amplifier circuits used to measure the voltage that appears on the sensor output line COL 106, which will lead to fixed pattern noise that is column-column dependent.

According to a simple noise model, the FPN may be considered to have two components:

(i) An offset component, whereby each array element sensor output has a constant offset (i.e. independent of the value of the impedance). The offset component of FPN may be denoted by a parameter K which assumes a different value for each element of the array.

(ii) A gain component, whereby each array element sensor output has a gain parameter M, such that the true value of the impedance J is related to that actually measured I by a relationship J=MI and where the gain parameter M may assume a different value for each element of the array.

This embodiment of the invention incorporates a method for driving the array element circuit 85 so as to measure the background fixed pattern noise pattern, which can then be removed from measurement images of sensor data using image processing methods, for example in a computer.

Figure 45:
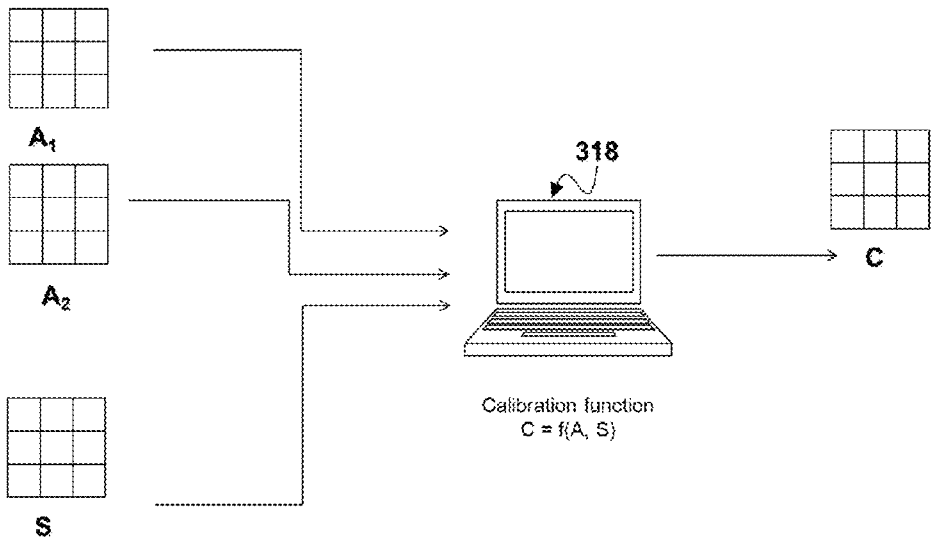
FIG. 45 shows the basic methodology of the calibration method of the fourteenth embodiment of the invention.

The basic methodology of the calibration method of the fourteenth embodiment is shown schematically in FIG. 45 and is described as follows:

(1) One or more calibration images A (e.g. $A_1$, $A_2$ etc) are obtained, which are a measure of the fixed pattern noise background that is present at each array element (2) A sensor image S is obtained in the usual way, as described for the first embodiment (3) A calibrated sensor output image C is calculated by some external means (e.g. a computer 318 processing the sensor output data) whereby the calibrated sensor output image is a function of the sensor image and the calibration images, e.g. C=f(A,S).

According to this embodiment, the array element circuit 85 of the AM-EWOD device is the same as used for the first embodiment and is shown in FIG. 24.

Figure 46:
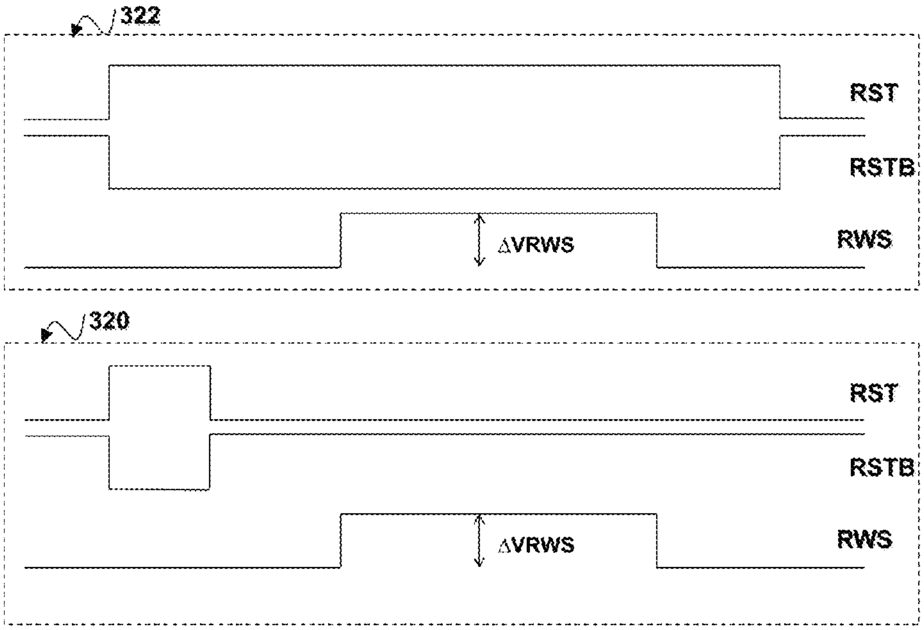
FIG. 46 shows timing schematics for generating the sensor image and calibration images in accordance with the fourteenth embodiment of the invention.

Voltages may be written to the array using an identical method to as was previously described. Similarly, the measured sensor image may be obtained using the method previously described. Calibration sensor output images are obtained by implementing a varying timing sequence to the array element circuit 85 shown in FIG. 24. The sensor timing sequences 320, showing the drive signals RST, RSTB and RWS, used to obtain the sensor image S, and the calibration timing sequence 322, used to obtain the calibration image(s) A are both shown in FIG. 46. The timings and voltage levels of the applied sensor signals are also described as follows.

To obtain a calibration image for an element within the array, a calibration voltage is first selected and the reset voltage VRST is set to this value, denoted VRST1. The reset operation is then turned on, by taking RST 108 to its logic high level and RSTB 200 to its logic low level. The potentials associated with both of these voltage levels is the voltage VRST1, and as a result the sense node 102 is maintained at this voltage VRST1. With RST remaining at logic high level and RSTB at logic low level, a voltage pulse of amplitude ΔVRWS is then applied to the sensor row select line RWS 104. However, since the reset remains switched on, the sense node 102 remains pinned at potential VRST1 and is unaffected by the voltage pulse on RWS.

As previously, transistor 94 (which is loaded by a suitable biasing device, e.g. a resistor, which forms part of the column amplifier 79) operates as a source follower and the output voltage appearing at the sensor output line COL 106 is a function of the characteristics of this transistor and of the voltage VRST1. The voltage at COL may then be sampled and read out by the column amplifier 79 in an identical manner as was used in measuring the sensor image.

The timing schematic 322 used to obtain the calibration image A is therefore similar to that used to the timing schematic 320 used obtain the sensor image S, the only difference being that the reset remains switched on for the duration of the RWS voltage pulse.

By operating the sensor using the calibation timing schematic 322 a calibration frame of image data is obtained. This calibration image essentially shows the output of the sensor electronics when a voltage VRST1 is applied to the sense node 102 of each array element circuit 85. The calibration image is thus a map of the offset fixed pattern noise associated with the sensor readout electronics. Denoting this calibration image $A_1$, a calibrated image of sensor data $C_1$ may be obtained by evaluating the function $$f(A,S)=C_1=S-A_1$$

where S is the sensor output image (uncalibrated) and the subtraction is performed individually for each array element. The calculation may be performed by electronic means in output signal processing, e.g. by a computer. According to this mode of operation, VRST1 may be chosen to correspond to a value where the transistor 94 is just turned on, for example by setting VRST equal to the average threshold voltage of transistor 94. An advantage of this implementation of the calibration method, is that by obtaining the calibration image $A_1$ the offset component of fixed pattern noise may be removed from the image of sensor data.

This method of calibration, whereby a single calibration image is obtained and subtracted may be refered to as a "1-point calibration". Whilst a 1-point calibration is simple to implement and is effective in removing the offset component of FPN, it has a disadvantage in that it is unable to quantify and remove the gain component of FPN.

An alternative implementation is therefore also possible whereby two calibration images are obtained $A_1$ and $A_2$. $A_1$ may be obtained as described above. $A_2$ is then also obtained, using an identical timing sequence as was used to obtain $A_1$ but with a different value of VRST, denoted VRST2. Typically VRST2 may be chosen to correspond to a condition where transistor 94 is turned on, for example setting VRST2 to the average threshold voltage of transistor 94 plus 3V. With two calibration images $A_1$ and $A_2$ available, two-point calibration may be carried out whereby both the offset and gain components are removed. According to one method of performing two point calibration, the calibrated sensor image $C_2$ maybe obtained from the function $$f(A,S)=C_2=\frac{S}{A_2-A_1}-A_1$$

In the above equation, each term corresponds to an array of data, and the division operation is performed on an element by element basis of each element in the array. As previously described, the calculation of $C_2$ may be performed in output signal processing, e.g. using a computer 318.

The 1-point and 2-point calibration methods described are thus exemplary methods of removing fixed pattern noise from the sensor output image. Other calibration methods may also be devised, for example using two or more calibration images and assuming a polynomial model for the fixed pattern noise as a function of the load impedance. In most practical cases however it is anticipated that 1-point calibration or 2-point calibration as described will be effective in removing or substantially reducing fixed pattern noise.

In performing either 1-point or 2-point calibration, it may be noted that it is not necessary for new calibration images $A_1$ (or $A_1$ and $A_2$) to be obtained for each new value of S. Instead it may be preferable to obtain new calibration images occasionally, e.g. once every few seconds, save these calibration images to memory (e.g. in a computer 318) and perform the calibration calculation based on the most recently obtained set of calibration images.

It may further be noted that the described method of calibration works equally well whether liquid is present or not present at a given array element, since in either case the sense node 102 remains pinned at VRST as is unaffected by the impedance present at the EW drive electrode 152.

It may further be noted that in the above description, the calibration image $A_1$ and $A_2$ were obtained retaining a pulse of amplitude ΔVRWS on the RWS input. Such a timing scheme is convenient to implement since then the only difference in the applied timings between obtaining the sensor image S and the calibration images $A_1$ and $A_2$ is in the timing of the RST and RSTB signals. However it is not essential to apply the pulse to RWS in obtaining calibration images $A_1$ and $A_2$, and it would also be possible to simply measure the output at COL.

An advantage of a calibration mode of operation as described is that fixed pattern noise may be removed from the sensor output image. This is likely to be particularly useful in applications of the sensor requiring precise analogue measurement of the droplet impedance, for example in determining droplet volume. Operating in a calibrated mode as described is likely to result in an improvement in the accuracy to which the impedance can be measured and hence the size of the liquid droplet 4 may be determined.

It may further be noted that as well as removing fixed pattern noise due to component mismatch, the calibration methods described above may also be effective in removing noise due to changes in ambient conditions, e.g. temperature or illumination level, either in time or spatially across the array. This is a further advantage of operating in a mode with a calibration being performed as has been described.

It will be appreciated to one skilled in the art that whilst the fourteenth embodiment has been described as a modification in the operation of the first embodiment, the same method for performing a calibration may equally be applied to other embodiments of the invention using an identical or similar means of driving as that described. For example, in the case of the third embodiment, where the device has the array element circuit 85 shown in FIG. 31, the calibration images $A_1$ (or $A_1$ and $A_2$) would be obtained by holding on the reset function, in this case achieved by maintaining the reset transistor 206 switched on so as to maintain the bias VRST at the sense node 102. Calibration images, and thus a calibrated sensor output image $C_1$ (or $C_2$) are then obtained in the same way as was previously described.

The fifteenth embodiment is as any of the previous embodiments where the droplets consist of a non-polar material (e.g. oil) immersed in a conductive aqueous medium. An advantage of this embodiment is that the device may be used to control, manipulate and sense liquids which are non-polar.

It will be apparent to one skilled in the art that any of the array element circuits 85 of the previous embodiments can be implemented in an AM-EWOD device whereby thin film electronics are disposed upon a substrate to perform the dual functions of programming an EWOD voltage and sensing capacitance at multiple locations in an array.

Suitable technologies for integrated drive electronics and sensor output electronics have been described in the prior art section.

It will be further apparent to one skilled in the art that such an AM-EWOD device can be configured to perform one or more droplet operations as described in prior art, where the sensor function described can be used to perform any of the functions described in prior art.

It will be further apparent to one skilled in the art that the AM-EWOD device described could form part of a complete lab-on-a-chip system as described in prior art. Within such as system, the droplets sensed and/or manipulated in the AM-EWOD device could be chemical or biological fluids, e.g. blood, saliva, urine, etc., and that the whole arrangement could be configured to perform a chemical or biological test or to synthesise a chemical or biochemical compound.

Although the invention has been shown and described with respect to a certain embodiment or embodiments, equivalent alterations and modifications may occur to others skilled in the art upon the reading and understanding of this specification and the annexed drawings. For example, while the present invention has been described herein primarily in the context of an EWOD device it will be appreciated that the invention is not limited to an EWOD device and may also be utilized more generally in any type of array device in which it is desirable to incorporate an integrated impedance sensor. For example, it will be apparent to one skilled in the art that the invention may also be utilized in alternative systems wherein there is a requirement to write a voltage to a drive electrode and sense the impedance at the same node. For example the invention may be applied to a droplet manipulation dielectrophoresis system such as described in the prior art section which also contains an integrated impedance sensor capability. According to another example, the invention may be applied to an electrowetting based display, as for example described in the prior art section, having an-inbuilt capability for sensing the impedance of the fluid material used to determine the optical transmission of the display. In this application the impedance sensor capability may be used, for example as a means for detecting deformity of the fluid material due to the display being touched and thus function as a touch input device. Alternatively the impedance sensor capability may be used as a means for detecting faulty array elements which do not respond in the correct manner to the applied EW drive voltage.

In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

Industrial Applicability

By integrating sensor drive circuitry and output amplifiers into the AM-EWOD drive electronics, the impedance can be measured at a large number of points in an array with only a small number of connections being required to be made between the AM-EWOD device and external drive electronics. This improves manufacturability and minimises cost compared to the prior art

The invention claimed is:

1. A static random-access memory (SRAM) cell comprising:

a sampling switch and a feedback switch; and a first inverter and a second inverter connected in series whereby an output of the first inverter is connected to an input of the second inverter, wherein an input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

2. The SRAM cell according to claim 1, further comprising timing circuitry configured to switch the sampling switch and feedback switch at different times with respect to each other during a predefined operation.

3. An active-matrix device, comprising:

a plurality of array element circuits arranged in rows and columns;

a plurality of source addressing lines each shared between the array element circuits in corresponding same columns;

a plurality of gate addressing lines each shared between the array element circuits in corresponding same rows; and a plurality of sensor row select lines each shared between the array element circuits in corresponding same rows, wherein each of the plurality of array element circuits comprises:

an array element which is controlled by application of a drive voltage by a drive element;

writing circuitry for writing the drive voltage to the drive element, the writing circuitry being coupled to a corresponding source addressing line and gate addressing line among the plurality of source addressing lines and gate addressing lines, and including a static random-access memory (SRAM) cell for storing the drive voltage which is written to the drive element; and sense circuitry for sensing an impedance presented at the drive element, the sense circuitry being coupled to a corresponding sensor row select line;

wherein the SRAM cell comprises:

a sampling switch and a feedback switch; and a first inverter and a second inverter connected in series whereby an output of the first inverter is connected to an input of the second inverter, wherein an input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

4. The active-matrix device according to claim 3, wherein the data input of the SRAM cell is connected to the corresponding source addressing line and the data output of the SRAM cell is connected to the corresponding drive element.

5. The active-matrix device according to claim 4, comprising timing circuitry configured to switch the sampling switch and feedback switch within a given one of the SRAM cells at different times with respect to each other during a predefined operation.

6. The active-matrix device according to claim 5, wherein as part of a write operation in order to write the drive voltage to a drive element via the corresponding SRAM cell, the timing circuitry is configured to effect:

(a) turning on the sampling switch to connect the data at the data input to the drive element;

(b) turning on the feedback switch to effect a closed loop which holds the data at the drive element; and (c) subsequent to (a) and (b), turning off the sampling switch to disconnect the input of the first inverter from the data input.

7. The active-matrix device according to claim 6, wherein the predefined operation is a sensor operation following the write operation, and as part of the sensor operation the timing circuitry is configured to:

(d) while the sampling switch remains off following (c), turn off the feedback switch to effect an open loop whereafter the sense circuitry senses the impedance presented at the drive element.

8. The active-matrix device according to claim 7, wherein as part of the sensor operation the timing circuitry is configured to:

(e) subsequent to (d) and while the sampling switch remains off following (c), turn on the feedback switch to effect the closed loop which holds the data at the drive element.

9. The active-matrix device according to claim 3, wherein the sampling switches of the respective SRAM cells are controlled by a clock signal on the corresponding gate addressing line.

10. The active-matrix device according to claim 3, wherein the feedback switches of the respective SRAM cells are controlled by a clock signal on a corresponding sensor enable line.

11. The active-matrix device according to claim 10, wherein the corresponding sensor enable line is shared between all of the array element circuits in corresponding same rows.

12. The active-matrix device according to claim 10, wherein the corresponding enable line is shared among all the plurality of array element circuits.

13. The active-matrix device according to claim 3, wherein the SRAM cells each include only the sampling switch and the feedback switch insofar as switches, and clock signals provided to the sampling switch and the feedback switch are not complementary.

14. The active-matrix device according to claim 3, wherein the array elements are hydrophobic cells having a surface of which the hydrophobicity is controlled by the application of the drive voltage by the corresponding drive element, and the corresponding sense circuitry senses the impedance presented at the drive element by the hydrophobic cell.

15. The active-matrix device according to claim 3, wherein with respect to each of the plurality of array element circuits:

the writing circuitry is configured to perturb the drive voltage written to the drive element;

the sense circuitry is configured sense a result of the perturbation of the drive voltage written to the drive element, the result of the perturbation being dependent upon the impedance presented at the drive element; and the sense circuitry includes an output for producing an output signal a value of which represents the impedance presented at the drive element.

16. The active-matrix device according to claim 3, wherein:

the active-matrix device includes a plurality of sensor output lines each shared between the array element circuits in corresponding same columns, and the outputs of the plurality of array element circuits are coupled to a corresponding sensor output line.

17. A device having an array element circuit with an integrated impedance sensor, comprising:

an array element which is controlled by application of a drive voltage by a drive element;

writing circuitry for writing the drive voltage to the drive element, the writing circuitry comprising a static random-access memory (SRAM) cell; and sense circuitry for sensing an impedance presented at the drive element;

wherein the SRAM cell comprises:

a sampling switch and a feedback switch; and a first inverter and a second inverter connected in series whereby an output of the first inverter is connected to an input of the second inverter, wherein an input of the first inverter is connected to a data input of the SRAM cell via the sampling switch, and to a data output of the SRAM cell independent of the feedback switch, an output of the second inverter is connected to the input of the first inverter via the feedback switch, and first and second clock inputs of the SRAM cell are configured to control the sampling switch and the feedback switch, respectively.

18. The device according to claim 17, wherein the data input of the SRAM cell is connected to the corresponding source addressing line and the data output of the SRAM cell is connected to the corresponding drive element.

19. The device according to claim 17, wherein the array element is a hydrophobic cell having a surface of which the hydrophobicity is controlled by the application of the drive voltage by the drive element, and the sense circuitry senses the impedance presented at the drive element by the hydrophobic cell.

20. The device according to claim 17, wherein:

the writing circuitry is configured to perturb the drive voltage written to the drive element;

the sense circuitry is configured to sense a result of the perturbation of the drive voltage written to the drive element, the result of the perturbation being dependent upon the impedance presented at the drive element; and the sense circuitry includes an output for producing an output signal a value of which represents the impedance presented at the drive element.

* * * * *